(12) United States Patent
Hashimoto et al.

(10) Patent No.: US 8,928,789 B2
(45) Date of Patent: Jan. 6, 2015

(54) SOLID-STATE IMAGING APPARATUS

(75) Inventors: Seiji Hashimoto, Yokohama (JP); Kazuyuki Shigeta, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 13/820,978

(22) PCT Filed: Sep. 28, 2011

(86) PCT No.: PCT/JP2011/072907
§ 371 (c)(1),
(2), (4) Date: Mar. 5, 2013

(87) PCT Pub. No.: WO2012/043867
PCT Pub. Date: Apr. 5, 2012

(65) Prior Publication Data
US 2013/0162874 A1    Jun. 27, 2013

(30) Foreign Application Priority Data

Sep. 30, 2010 (JP) ................................. 2010-221199
Sep. 30, 2010 (JP) ................................. 2010-222371

(51) Int. Cl.
| | |
|---|---|
| *H04N 3/14* | (2006.01) |
| *H04N 5/335* | (2011.01) |
| *H04N 3/16* | (2006.01) |
| *H01L 27/146* | (2006.01) |
| *H04N 5/378* | (2011.01) |
| *H04N 5/243* | (2006.01) |

(52) U.S. Cl.
CPC .......... *H01L 27/14641* (2013.01); *H04N 5/378* (2013.01); *H04N 5/243* (2013.01)
USPC .......................................... 348/300; 348/255

(58) Field of Classification Search
CPC ................................. H04N 5/378; H04N 5/20
USPC .................................. 348/222, 229.1, 255, 300
See application file for complete search history.

(56) References Cited

U.S. PATENT DOCUMENTS

| | | | |
|---|---|---|---|
| 6,538,695 B1 | 3/2003 | Xiao et al. | 348/245 |
| 7,573,518 B2 | 8/2009 | Nakamura et al. | 348/302 |
| 7,859,575 B2 | 12/2010 | Ota et al. | 348/222.1 |
| 8,189,086 B2 | 5/2012 | Hashimoto et al. | 348/300 |
| 8,310,576 B2 | 11/2012 | Hashimoto et al. | 348/300 |
| 8,390,710 B2 | 3/2013 | Shigeta et al. | 348/296 |
| 2004/0080637 A1 | 4/2004 | Nakamura et al. | 348/255 |
| 2009/0322903 A1 | 12/2009 | Hashimoto et al. | 348/229.1 |
| 2010/0157083 A1 | 6/2010 | Ohya et al. | 348/222.1 |
| 2013/0228673 A1 | 9/2013 | Hashimoto et al. | 250/208.1 |

FOREIGN PATENT DOCUMENTS

| | | |
|---|---|---|
| JP | 11-88166 A | 3/1999 |
| JP | 2004-15701 A | 1/2004 |
| JP | 2010-16416 A | 1/2010 |
| WO | WO 2009/137040 A1 | 11/2009 |

*Primary Examiner* — Gevell Selby
(74) *Attorney, Agent, or Firm* — Fitzpatrick, Cella, Harper & Scinto

(57) ABSTRACT

A solid-state imaging apparatus comprising a plurality of pixels generating a photoelectric conversion signal, a column amplifying unit corresponding to columns of the pixels, for outputting a first and second signals generated by amplifying the photoelectric conversion signal at a smaller first gain and larger second gain respectively, an analog to digital converter (21) for converting the first and second signals from an analog signal to a digital signal, a comparing unit (224) for inputting the digital signal from the analog to digital converter, level-shifting into the same gain level the first and second signals converted by the analog to digital converter, and thereafter detecting a gain error between the level-shifted first and second signals, and a correction unit (226) for correcting the first and second signals based on the gain error.

15 Claims, 18 Drawing Sheets

SOLID-STATE IMAGING APPARATUS

TECHNICAL FIELD

The present invention relates to a solid-state imaging apparatus.

BACKGROUND ART

Solid-state imaging apparatuses are required to have an improved S/N ratio and an increased dynamic range. In order to meet such requirements, an amplifying circuit and a detection circuit which detects the signal level of each pixel signal in each of columns of pixels arranged in a matrix are provided for each column in Japanese Patent Application Laid-Open No. 2004-015701. With this configuration, signal saturation in each column amplifying circuit is avoided, the gains of pixel signals are controlled such that small-amplitude ones are not saturated, and the gains are returned to the original values in a downstream circuit.

In Japanese Patent Application Laid-Open No. 2010-16416, a column amplifying circuit for each of columns generates a low-gain signal and a high-gain signal from each pixel signal from an imaging device. Signals obtained by returning high-gain signals to the same gain as the gain of low-gain signals and the low-gain signals are selectively combined to increase a dynamic range while maintaining an S/N ratio.

Japanese Patent Application Laid-Open No. H11-088166 describes a conversion error correction method at the time of AD conversion.

However, in the technique disclosed in Japanese Patent Application Laid-Open No. 2004-015701, a detection circuit for detecting a pixel signal is provided for each of columns of pixels, and a gain change is performed for each column. A circuit for controlling the configuration is more complicated, and a solid-state imaging apparatus occupies a larger area. In addition, the pixels have different S/N ratios.

In Japanese Patent Application Laid-Open No. 2004-015701 and Japanese Patent Application Laid-Open No. 2010-16416, a pixel signal is changed in gain by a column amplifying unit and is subjected to AD conversion. However, the disclosed techniques do not include detection of a gain error and an AD conversion error caused by the processing of the pixel signal and a method for correcting the errors. The technique disclosed in Japanese Patent Application Laid-Open No. H11-088166 is intended to correct a conversion error between before and after AD conversion in an AD converter itself. The technique is not a method for correcting a gain error between signals which are amplified at different gains by a plurality of column amplifying units and a plurality of column AD converters.

CITATION LIST

Patent Literature

PTL 1: Japanese Patent Application Laid-Open No. 2004-015701
PTL 2: Japanese Patent Application Laid-Open No. 2010-16416
PTL 3: Japanese Patent Application Laid-Open No. H11-088166

SUMMARY OF INVENTION

According to an aspect of the present invention, a solid-state imaging apparatus comprises: a plurality of pixels arranged in a matrix for generating a signal by a photoelectric conversion; a column amplifying unit arranged corresponding to each of columns of the pixels, for outputting a first signal generated by amplifying the signal from the plurality of pixels at a first gain, and for outputting a second signal generated by amplifying the signal from the plurality of pixels at a second gain larger than the first gain; an analog to digital converter for converting the first and second signals from an analog signal to a digital signal; a comparing unit for inputting the digital signal from the analog to digital converter, level-shifting into the same gain level the first and second signals, and thereafter detecting a gain error between the level-shifted first and second signals; and a correction unit for correcting the first and second signals based on the gain error.

DESCRIPTION OF EMBODIMENTS

First Embodiment

Possible problems with the methods disclosed in Japanese Patent Application Laid-Open No. 2004-015701 and 2 will be described in more detail in order to clarify features of a first embodiment of the present invention. Consider signal-level errors and analog to digital (AD) conversion errors when designs with two different gains (e.g., a design G1 with a gain of 1 and a design G8 with a gain of 8) are prepared.

Figure 18:
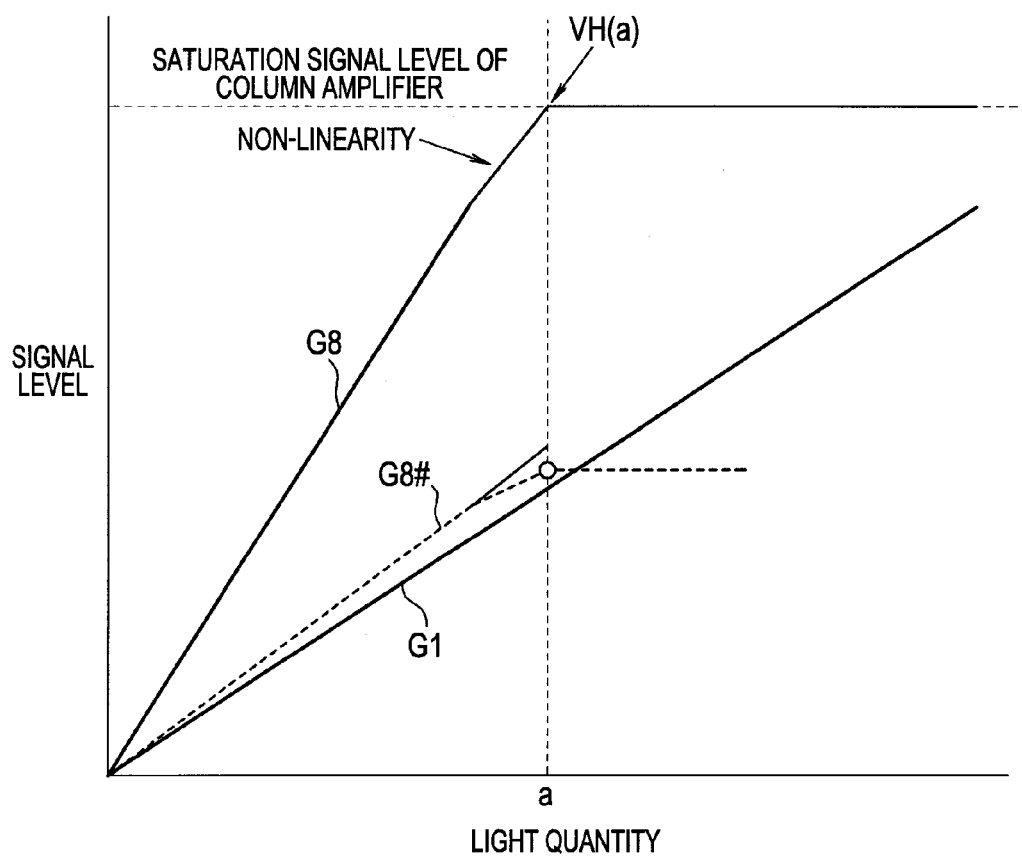
FIG. 18 is a signal level chart for describing a gain error.

FIG. 18 illustrates a signal level chart for describing a gain error. In FIG. 18, the abscissa represents the quantity of reflected light from an object while the ordinate represents a pixel signal level at the light quantity. A design G8# is obtained by returning the design G8 to the same gain as the gain of the design G1. Since there is an error caused by a semiconductor process between the gains of column amplifying circuits, if a small-signal portion (a small-light-quantity portion) of a line indicated by G1 is replaced with a line indicated by G8# in a downstream circuit, as illustrated in FIG. 18, a signal level difference corresponding to a light quantity from the signal level of the design G1 occurs. If a determination when the small-signal portion of the line indicated by G1 is replaced with the line indicated by G8# is made based on a neighborhood VH(a) of a full saturation signal level for a signal of the design G8, signal saturation or signal nonlinearity of a pixel signal in each column amplifying unit is also an error factor.

A gain error will be expressed by a simple expression. Let a and b be gain errors in the designs G1 and G8 and α be a conversion error in an AD converting unit. Assuming that the gain errors and conversion error are several percent, data DA(G1) and data DA(G8) which are obtained by AD-converting the gains G1 and G8 are given as approximations by Expressions (1) and (2) below.

$$DA(G1)=(1+a)(1+\alpha)\approx 1+a+\alpha \quad (1)$$

$$DA(G8)=(8+b)(1+\alpha)\approx 8(1+\alpha)+b \quad (2)$$

An expression for returning the data DA(G8) to the original gain of 1 is given below as Expression (3), and a difference ΔV between Expression (3) and Expression (1) is given by Expression (4) below.

$$DA(G8/8)=DA(G8)\times \frac{1}{8}=1+\alpha+b/8 \quad (3)$$

$$\Delta V=DA(G8/8)-DA(G1)=b/8-a \quad (4)$$

Even if the difference ΔV in Expression (4) is several percent, the difference ΔV is visually recognized as a difference in level in an image after the image is composed. Since human eyes are sensitive to such a difference in level, degradation of the quality of the image is clearly recognized.

Figure 1:
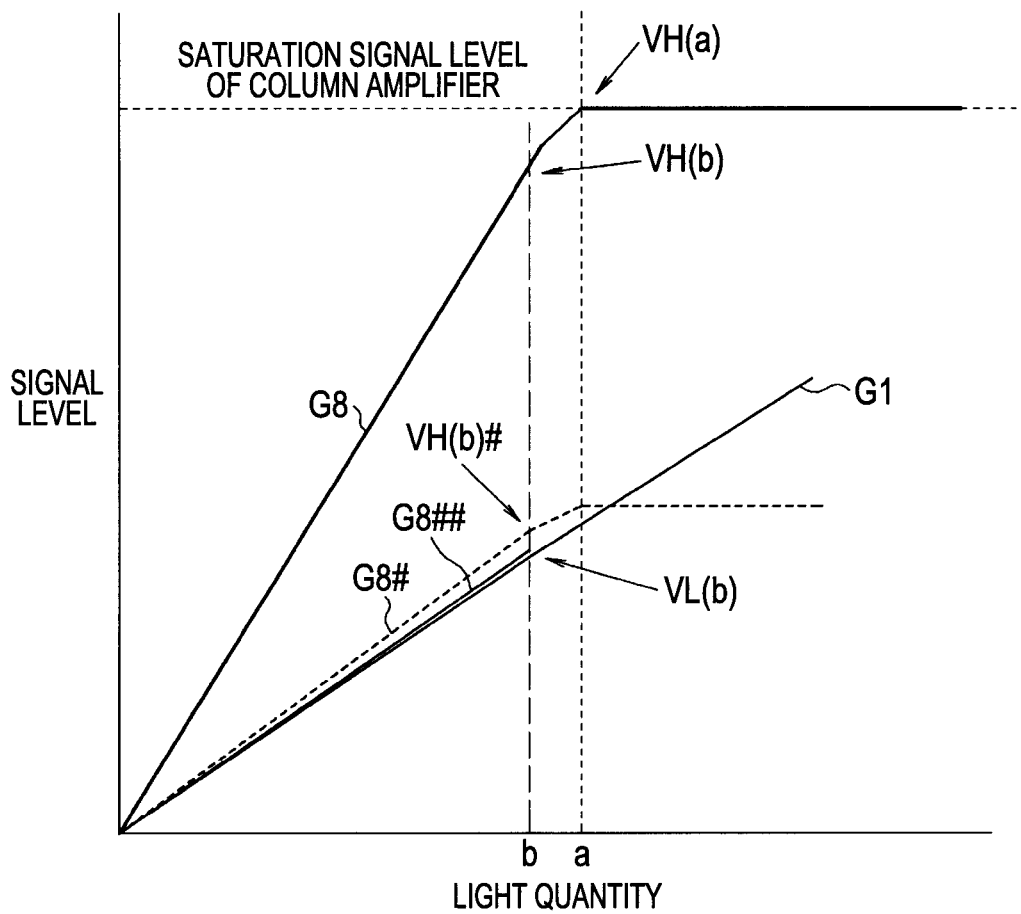
FIG. 1 is a signal level chart for describing an embodiment of the present invention.

The principle of the present invention will be described. FIG. 1 is a signal level chart for describing the present embodiment. A full saturation signal level VH(a) is the signal level of a second signal G8 at a light quantity a where the second signal G8 is fully saturated. Signals with two different gains are used to improve the S/N ratio of a pixel signal and increase a dynamic range. The present invention is directed to detecting a gain error due to different signal processes by a column amplifying unit, an AD converting unit, and the like and correcting the error or performing offset correction using a signal level difference as an offset voltage. In FIG. 1, a first signal G1 (hereinafter referred to as a signal G1) is a signal with a gain of 1, and the second signal G8 (hereinafter referred to as a signal G8) is a signal with a gain of 8. A signal G8# is a signal obtained by level-shifting the gain of the signal G8 after signal processing into the gain of the signal G1. The signal G8# and signal G1 have different slopes. The difference between the slopes corresponds to a gain error. Gain error detection according to the present embodiment is performed based on a signal level at a light quantity b with good signal linearity. A first signal level VH(b) is the signal level of the second signal G8 at the light quantity b less than a light quantity where the second signal G8 starts to be saturated and is a signal level less than a saturation start signal level. A signal level VL(b) is the signal level of the first signal G1 at the light quantity b. A signal level VH(b)# is the signal level of the signal G8# at the light quantity b. Since a gain error is (VH(b)#/VL(b)), a correction factor K is represented by Expression (5) below that is the reciprocal of a gain error.

$$K=VL(b)/VH(b)\# \quad (5)$$

Since a signal level difference is VH(b)#−VL(b), a correction value Voffset for an offset voltage is represented by the expression below.

$$Voffset=-(VH(b)\#-VL(b)) \quad (6)$$

The signal G8# can be converted to a signal G8## at the same signal level as the signal level of the signal G1 by multiplying the signal G8# by a correction factor K. Alternatively, a difference in level between signals can be reduced by performing offset correction on a signal level not less than VL(b) of the signal G1 using an offset voltage correction value represented by Expression (6). By returning the signal G8 to the gain of the signal G1 with the signal processing, noise in a small-amplitude signal caused by a signal processing circuit can be reduced to 1/G8. Gain error detection is performed not when a signal level is not a saturation signal level but when the signal level is a signal level with good linearity, and a correction factor is calculated. Accordingly, a signal level difference at the time of signal combination, i.e., a connecting portion in an image can be reduced.

Figure 2:
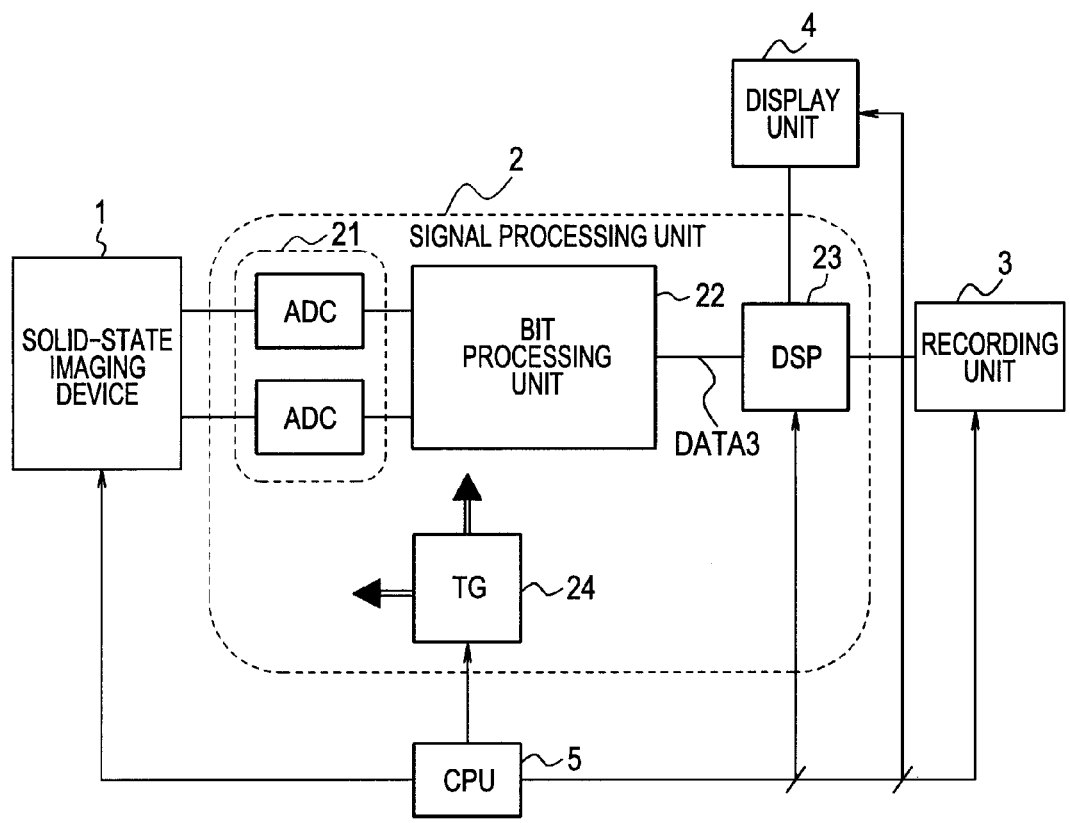
FIG. 2 is a block diagram of the whole of a solid-state imaging apparatus according to a first embodiment.

FIG. 2 illustrates a block diagram of the whole of a solid-state imaging apparatus according to the first embodiment of the present invention. The solid-state imaging apparatus includes a solid-state imaging device 1 which outputs in parallel different gain signals of a photographed image, a signal processing unit 2 which processes a signal from the solid-state imaging device 1, and a recording unit (medium) 3 on which an image signal from the signal processing unit 2 is recorded. The solid-state imaging apparatus also includes a display unit 4 which displays an image signal from the signal processing unit 2, an image signal from the recording unit 3, and the like and a CPU 5 which controls the above-described constituent units. The signal processing unit 2 includes an analog to digital converting unit (AD converting unit) 21 which converts a first signal G1 and a second signal G8 with different gains from the solid-state imaging device from an analog signal to a digital signal and a bit processing unit 22 which forms combined signals from signals output from the AD converting unit 21. The signal processing unit 2 further includes a DSP 23 which performs camera signal processing on a signal from the bit processing unit 22 and a timing generator (TG) 24 which generates signal processing timing pulses for the AD converting unit 21, bit processing unit 22, and DSP 23. The AD converting unit 21 converts the first signal G1 and second signal G8 from an analog signal to a digital signal with different AD converting units.

Figure 3:
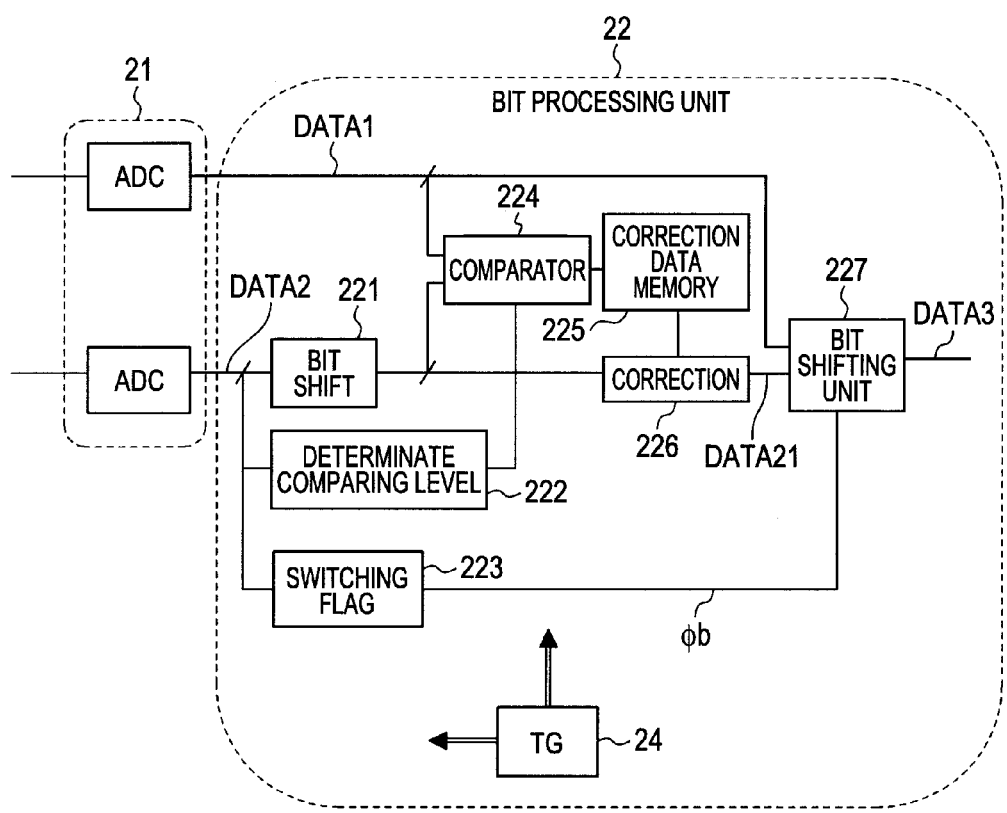
FIG. 3 is a diagram illustrating the schematic configuration of a bit processing unit according to the first embodiment of the present invention.

FIG. 3 is a diagram illustrating the schematic configuration of the bit processing unit 22 according to the first embodiment of the present invention. An output signal DATA1 from the AD converting unit 21, which converts an analog signal from the solid-state imaging device 1 to a digital signal, is a 12-bit signal obtained by AD-converting a first signal G1 with a low gain, and an output signal DATA2 is a 12-bit signal obtained by AD-converting a second signal G8 with a high gain. As described with reference to FIG. 1, a bit shifting unit 221 performs gain conversion for replacing the first signal DATA1

(G1) with the second signal DATA2 (G8) at a light quantity not more than b. Since a gain ratio between two signals in each column amplifying unit of the solid-state imaging device 1 is (G1/G8=1/8), the bit shifting unit 221 outputs a third signal G8# which is obtained by level-shifting the second signal DATA2 (G8) into the same gain level as the gain level of the first signal DATA1 (G1). More specifically, the bit shifting unit 221 multiplies the second signal DATA2 (G8) by a factor of ⅛ by digitally level-shifting the second signal DATA2 (G8) by 3 bits and outputs the signal G8#. Although the gain of a high-gain signal is set at 8 in the present embodiment, the high gain may be changed according to the photographic situation. For example, in the case of photographing using a relatively poorly lit object and requiring a gain as high as 16 as an imaging sensitivity, since a gain ratio is 16, 4-bit level shifting is performed.

A comparing level determination unit 222 determines whether the signal DATA2 (G8) is not more than the first signal level VH(b) at the light quantity b and outputs a signal indicating the light quantity b to a comparing unit 224. The comparing unit 224 receives the signal from the comparing level determination unit 222, compares the output signal G8# from the bit shifting unit 221 with the signal DATA1 (G1) at the light quantity b, and outputs a difference ΔV between the signal DATA1 (G1) and the signal G8#. As illustrated in FIG. 1, at the light quantity b, the signal G8 is unsaturated, and signal linearity is good. Accordingly, the comparing unit 224 can detect the gain error ΔV with high accuracy by detecting the gain error ΔV at the light quantity b. The gain error ΔV is represented by "b/8−a" as in Expression (4). The gain error ΔV varies depending on a column amplifying unit (to be described later) and whether a single AD converting unit is provided or separate AD converting units are provided but is basically largely affected by a gain error a for a low gain. A gain error here is caused by a difference from a design value for a gain (a target gain) of a column amplifier, variation between designed circuit devices in a semiconductor process, and the like.

The gain error ΔV detected by the comparator 224 is (VH (b)#/VL(b)), as described with reference to FIG. 1. The reciprocal of the gain error ΔV is stored as a gain error correction factor K or an offset voltage correction value is stored in a correction data memory unit 225. A correction unit 226 outputs a signal DATA21 (G8##) with a gain error corrected by multiplying the third signal G8# output from the bit shifting unit 221 by the correction factor K in the correction data memory unit 225 or a signal level difference corrected by adding or subtracting the offset voltage correction value. The correction unit 226 corrects the third signal G8# based on the correction factor K. Note that the correction unit 226 may correct one of the first signal DATA1 (G1) and second signal DATA2 (G8) based on the correction factor K or the offset voltage correction value.

A switching flag unit 223 outputs a selection signal φb at high level to a bit switching unit 227 when the second signal DATA2 (G8) has a signal level not more than the first signal level VH(b) at the light quantity b. The switching flag unit 223 outputs the selection signal φb at low level to the bit switching unit 227 when the second signal DATA2 (G8) is more than the first signal level VH(b) at the light quantity b. Alternatively, the switching flag unit 223 outputs the selection signal φb at high level to the bit switching unit 227 when the first signal DATA1 (G1) is not more than the signal level VL(b) at the light quantity b and outputs the selection signal φb at low level in the other cases. The bit switching unit 227 selects and outputs the signal DATA1 (G1) upon receipt of the selection signal φb at low level from the flag unit 223 and selects and outputs the signal DATA21 (G8##) upon receipt of the selection signal φb at high level from the flag unit 223.

The above signal switching means the following. In the case of photographing with a low photographic sensitivity (a low ISO speed and a low gain), meaning photographing in bright conditions, a signal G1 is obtained at a high light quantity (not less than the light quantity a). If the light quantity is more than the light quantity b, a signal DATA1 (G1) with a high S/N ratio is output without signal switching. With this operation, a wide-dynamic-range signal is obtained. In the case of photographing with a high photographic sensitivity (a high ISO speed and a high gain), meaning photographing in dark conditions, a signal DATA21 (G8##) with a high S/N ratio obtained by correcting a high-gain signal G8 is output at a light quantity not more than the light quantity b. This configuration enables prevention of the signal G8 from being adversely affected as a signal in the saturation region or in a region with non-linearity in the column amplifying unit at a light quantity not less than the light quantity b and not more than the light quantity a.

An allowable correction data range for correction data for different gains was investigated by an experiment. A result of the investigation showed that, at the light quantity b, a difference in level in an image started to become noticeable from a difference of only about 1 percent when the signal level VH(b) of a signal G8## was larger than the signal level VL(b) of a signal G1. When the signal level VH(b) of the signal G8## was smaller, a difference in level in an image started to become noticeable from a difference of about several percent. This seems to be because a person is tolerant to a change for the brighter, i.e., a phenomenon in which an image gradually becomes brighter at a connecting portion in the image and is intolerant to a change for the darker, which is a human visual feature. Accordingly, correcting the above-described correction factor K by multiplying the correction factor K by, e.g., 99 percent is more effective. Even if offset correction is performed instead of correction using a correction factor K, such a difference in level can also be made unnoticeable. Since correction using an offset voltage correction value is addition/subtraction processing and has the advantage of making a correction process easier.

Figure 4:
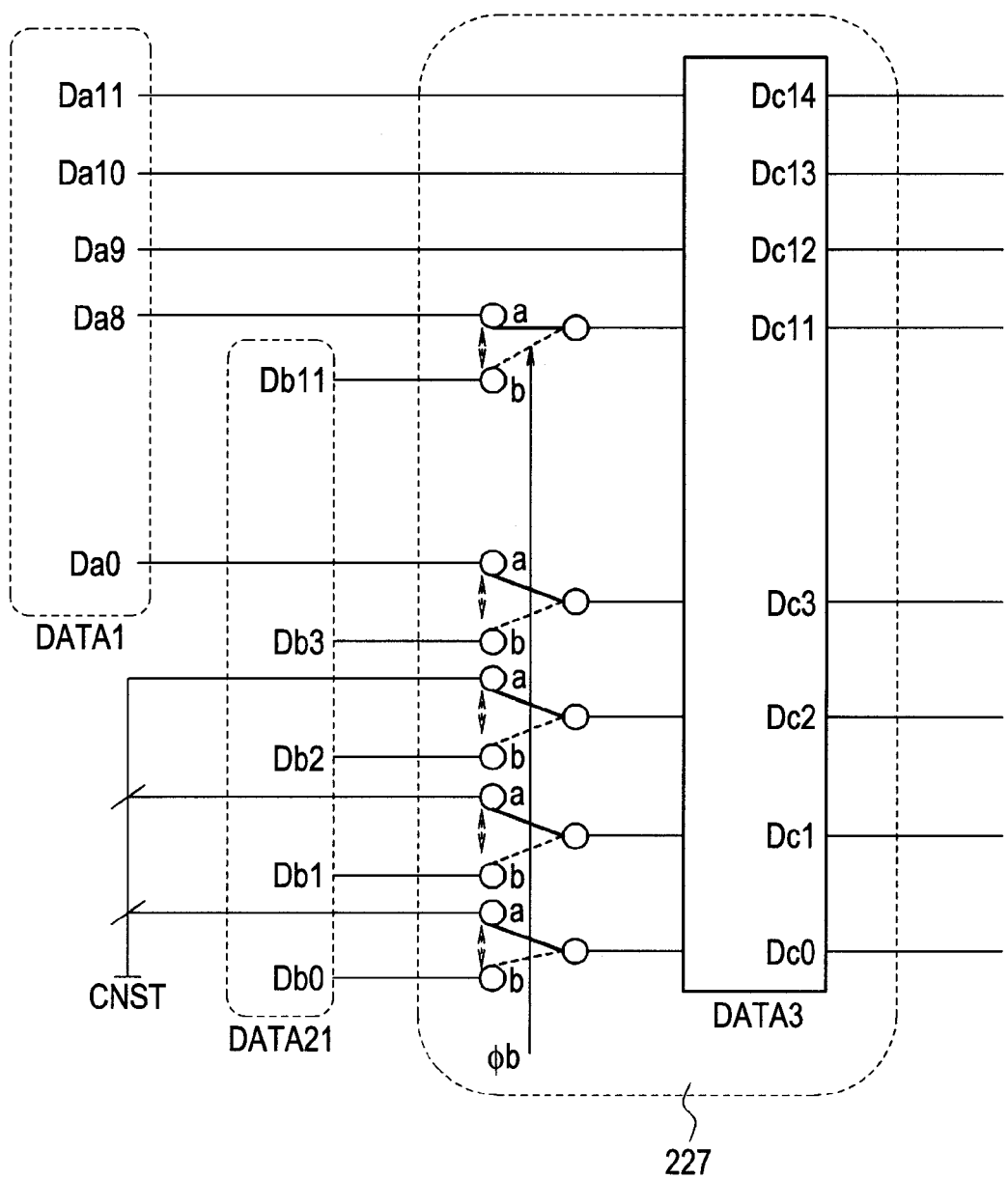
FIG. 4 is a diagram illustrating switching between sets of bits of AD-converted signals with different gains.

FIG. 4 is a diagram illustrating an example of the configuration of the bit switching unit 227. A case has been described with reference to FIG. 3 where the bit shifting unit 221 shifts a signal DATA2 by 3 bits (multiplies the signal DATA2 by a factor of ⅛). In FIG. 4, a signal DATA21 will be described as a signal which has been level-shifted by 3 bits with respect to a signal DATA1 and is input to the bit switching unit 227. The signals DATA1 and DATA21 are each assumed to have a resolution of 12 bits. Output terminals Da0 to Da11 and Db0 to Db11 are output terminals for bits of the data DATA1 and output terminals for bits of the data DATA21, respectively. Output terminals Dc0 to Dc14 are output terminals for bits of an output signal DATA3 from the bit switching unit 227. The terminals Da9 to Da11 are connected to the output terminals Dc12 to Dc14. The selection signal φb is a signal output by the switching flag unit 223. When the selection signal φb is at low level, switches connect a node CNST with fixed data (e.g., 0) and the terminals Da0 to Da8 to the output terminals Dc8 to Dc11. On the other hand, when the selection signal φb is at high level, the switches connect the terminals Db0 to Db11 to the output terminals Dc0 to Dc11. Switching between the two input signals DATA1 and DATA21 is controlled according to the selection signal φb from the switching flag unit 223. Since a gain ratio of the signal DATA21 to the signal DATA1 is 8, the signal DATA1 is multiplied by a factor of 8 by 3-bit shifting. As described above, the 15-bit wide-dynamic-range signal DATA3 can be acquired from the two 12-bit image signals DATA1 and DATA21. By detecting a gain error between different gains with high accuracy and performing gain correction, even if two images are combined into one, a difference in level in the image can be made hard to visually recognize.

Figure 5:
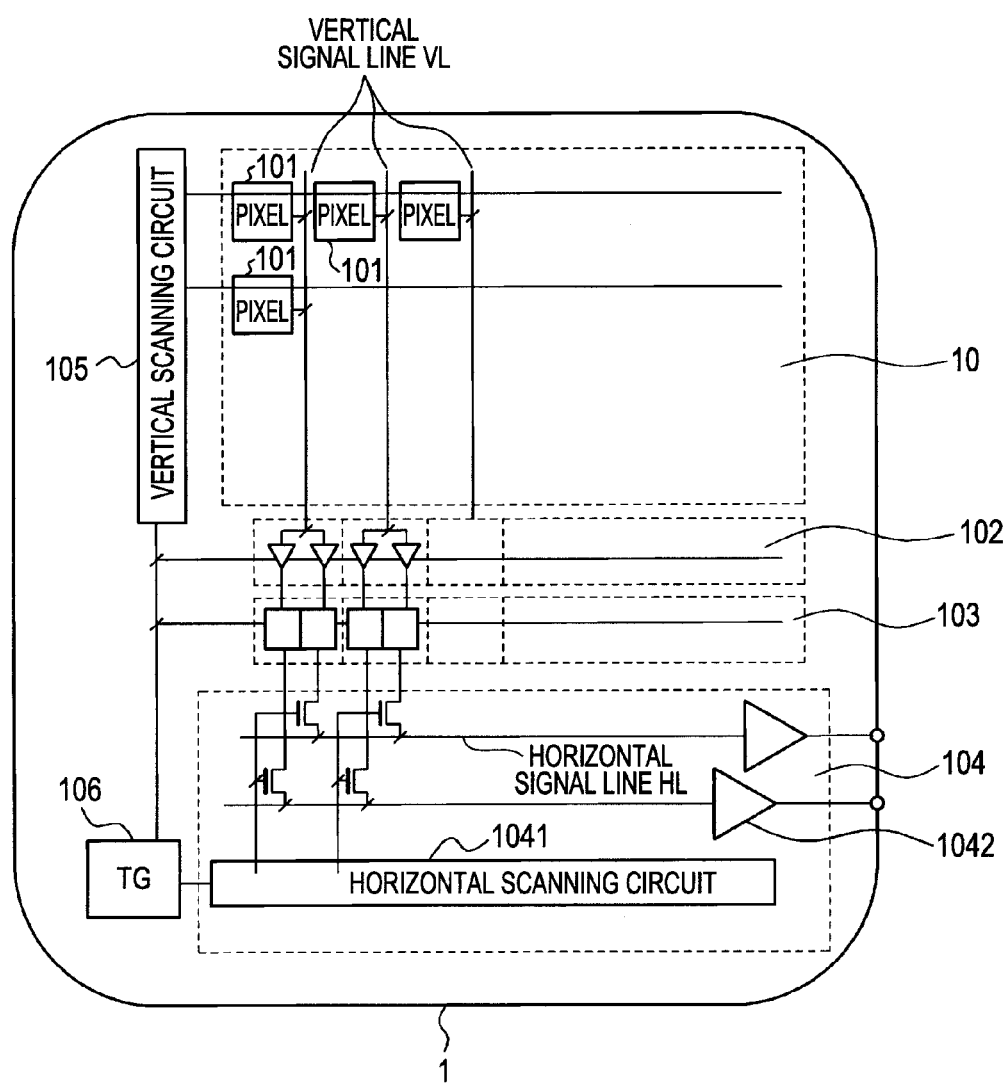
FIG. 5 is a diagram illustrating the schematic configuration of a solid-state imaging device according to the first embodiment of the present invention.

FIG. 5 illustrates the schematic configuration of the solid-state imaging device 1 according to the first embodiment of the present invention. The solid-state imaging device 1 includes a pixel unit 10 in which a plurality of pixels 101 is arranged in a matrix, a column amplifying unit 102, a memory unit 103, and an outputting unit 104. Each pixel 101 includes a photoelectric conversion element (photodiode) which generates a signal (electric charge) by a photoelectric conversion and may further include a pixel outputting unit which converts the electric charge generated in the photoelectric conversion element to a voltage signal and outputs the voltage signal and a pixel selecting unit for selecting the pixel 101. Although only four pixels 101 are illustrated for the sake of simplicity, there are actually pixels 101 with m rows and n columns in the pixel unit 10. Each column amplifying unit 102 is provided corresponding to each of the columns of the pixels 101. The column amplifying units 102 output first signals G1 generated by amplifying signals from the plurality of pixels 101 at a first gain (e.g., a gain of 1) and second signals G8 generated by amplifying the signals at a second gain (e.g., a gain of 8 larger than the first gain. In the present embodiment, each column amplifying unit 102 includes two amplifying units with different gains for each column. The gain of each amplifying unit is variable. The memory unit 103 temporarily stores signals with different gains from the corresponding column amplifying unit 102. The outputting unit 104 includes, for example, an output amplifier 1042 and outputs a signal to outside the solid-state imaging device 1 via the output amplifier 1042. The pixels 101 provided in the identical column are connected to the corresponding column amplifying unit 102 via an identical vertical signal line VL. The vertical signal line VL is provided for each column of the plurality of pixels 101 to connect the plurality of pixels 101 and the corresponding column amplifying unit 102. The spirit of the present embodiment does not change even if there is a plurality of vertical signal lines VL for each column. When the pixels 101 are selected by a vertical scanning circuit 105, each pixel 101 outputs a signal to the corresponding vertical signal line VL, and the signal is amplified by the corresponding column amplifying unit 102. The amplified signals are held in the corresponding memory unit 103. When switches connecting the memory unit 103 and horizontal signal lines HL are controlled to be turned on by a horizontal scanning circuit 1041, the signals amplified by the column amplifying unit 102 are output to the outside of the solid-state imaging device 1 via the output amplifiers 1042. A timing generating unit 106 is configured to supply signals to the vertical scanning circuit 105 and horizontal scanning circuit 1041. The timing generating unit 106 may supply signals for controlling the column amplifying units 102 and memory units 103. Note that the timing generating unit 106 may be provided outside the solid-state imaging device 1.

For the solid-state imaging device 1 illustrated in FIG. 5, the relationship of signal levels output from the solid-state imaging device 1 which are signal levels when the gains of each column amplifying unit 102 are 1 and 8 to the quantity of light incident on each pixel 101 has been described with reference to FIG. 1. A description of the relationship will be omitted. When each column amplifying unit 102 has a low gain, noise from the corresponding output amplifier 1042 is larger than noise from each pixel 101. In order to reduce output noise, a high-gain signal is generated. After AD conversion, the high-gain signal is returned to the original signal level to improve the S/N ratio.

Figure 6:
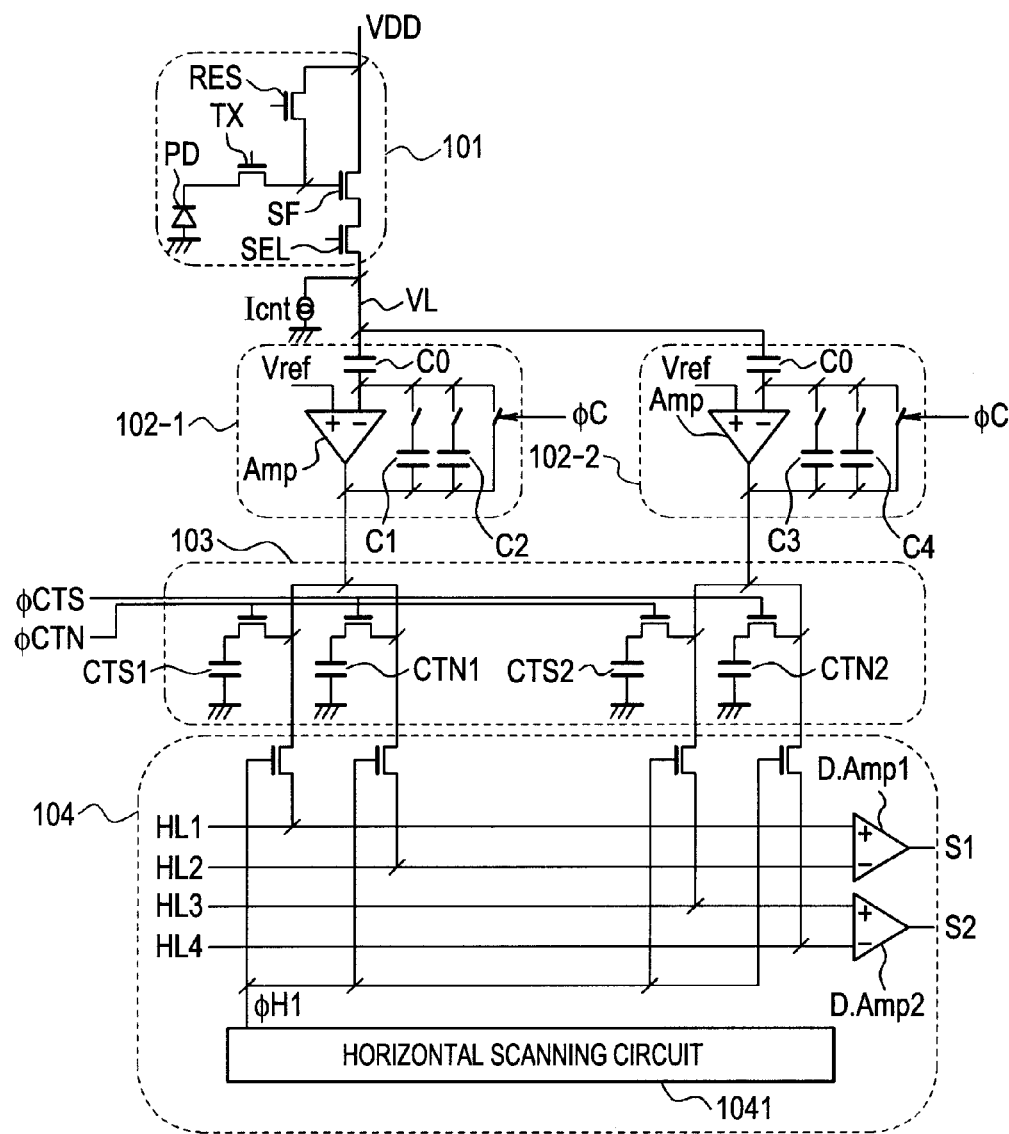
FIG. 6 is a schematic circuit diagram of two column amplifying units according to an example of the present invention.

FIG. 6 illustrates a schematic circuit diagram of two column amplifying units 102-1 and 102-2 in each column amplifying unit 102 according to the first embodiment of the present invention. FIG. 6 illustrates one extracted pixel in a certain column of pixels, and the two column amplifying units 102-1 and 102-2 are provided for each vertical signal line VL. Assume that input capacitors C0 of the column amplifying units 102-1 and 102-2 have the same capacitance value. The column amplifying units 102-1 and 102-2 are different in the magnitudes of the capacitances of feedback capacitors provided in a feedback path between an inversion input terminal and an output terminal of an operational amplifier Amp. Feedback capacitors C1 and C2 are connected to the column amplifying unit 102-1, and feedback capacitors C3 and C4 are connected to the column amplifying unit 102-2. The capacitance values of the feedback capacitors C1, C2, C3, and C4 are assumed to be 1 times, ½ times, ⅛ times, and ¹⁄₁₆ times, respectively, the capacitance value of the input capacitors C0. That is, in the present embodiment, the column amplifying unit 102 for each column includes the two column amplifying units 102-1 and 102-2 whose gains can be set to be different from each other. Each column amplifying unit 102 amplifies and outputs a first signal G1 and a second signal S8 with the different column amplifying units 102-1 and 102-2. Column amplifying units which can be set to have gains equal to each other may be used as long as the column amplifying units can be set to have gains different from each other. Holding capacitors CTS1 and CTS2 are controlled by a signal ϕCTS while holding capacitors CTN1 and CTN2 are controlled by a signal ϕCTN.

Figure 7:
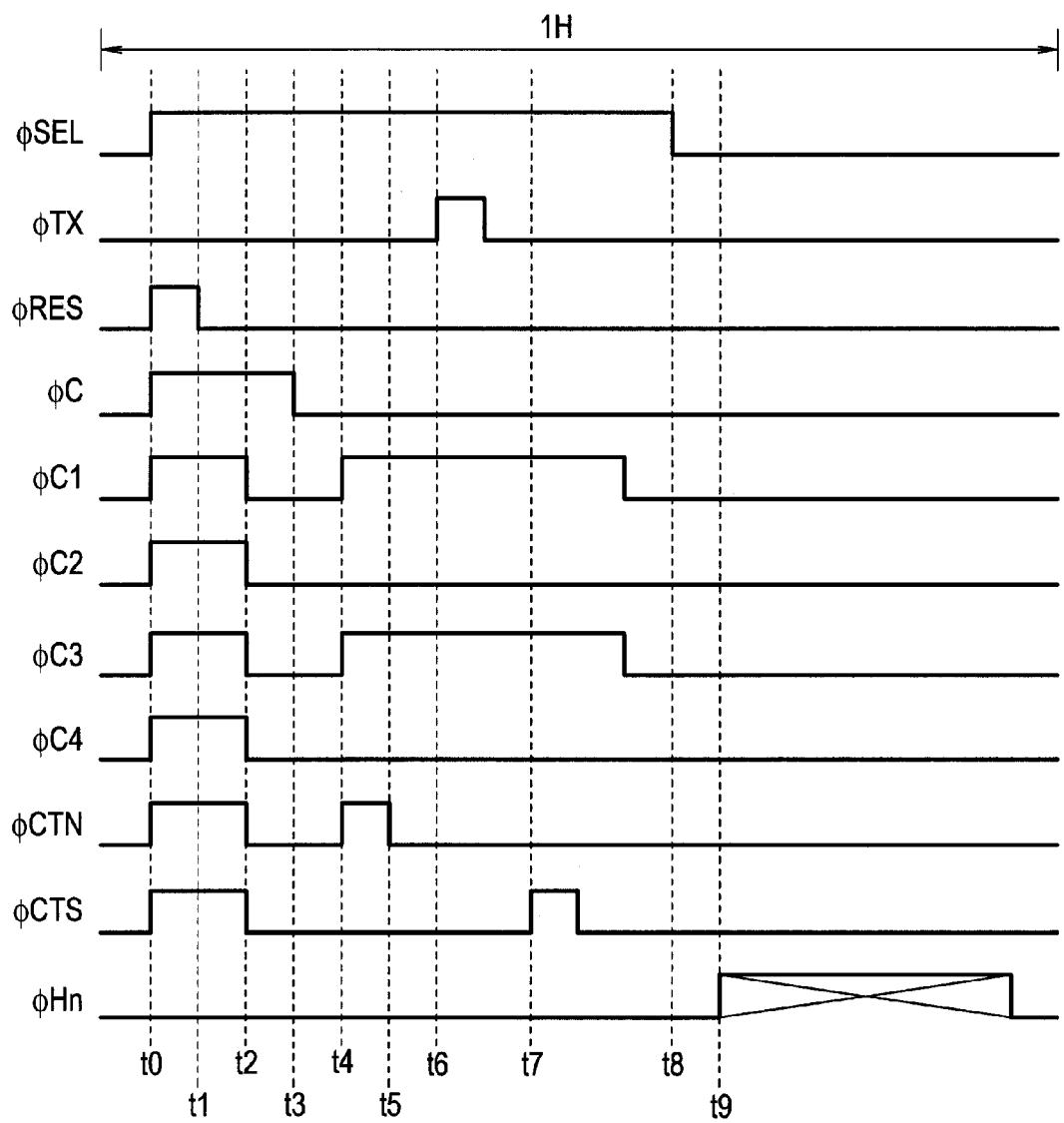
FIG. 7 is a schematic timing chart according to the example in FIG. 6.

Operation according to the present example will be described with reference to FIG. 7. FIG. 7 is a timing chart illustrating when signals are acquired from the solid-state imaging device, for one in a certain row of pixels arranged in a matrix. Assume here a case where the gain of the column amplifying unit 102-1 is 1 and the gain of the column amplifying unit 102-2 is 8.

First, at time t0, all signals except for signals ϕTX and ϕHn shift to high level. When a signal ϕSEL changes to high level, a pixel selecting unit SEL is brought into conduction. A source terminal of a pixel outputting unit SF and a constant current source Icnt are electrically connected to form a source follower circuit. The formation causes a level corresponding to the potential of a gate terminal of the pixel outputting unit SF to appear as a signal on the vertical signal line VL. Since a signal ϕRES is at high level at this time, a resetting unit RES is brought into conduction, and a level corresponding to a state in which the gate terminal of the pixel outputting unit SF is reset appears as a signal on the vertical signal line VL. In addition, signals ϕC, ϕC1, ϕC2, ϕC3, and ϕC4 change to high level, which causes the inversion input terminal and output terminal of each operational amplifier Amp to be short-circuited and the feedback capacitors C1, C2, C3, and C4 to be reset. Because of a virtual ground phenomenon in each operational amplifier Amp, the potentials of the terminals of the feedback capacitors C1 and C3 can be regarded as the same potential as a power supply potential Vref. Since the signals ϕCTN and ϕCTS are at high level, the holding capacitors CTN1, CTS1, CTN2, and CTS2 are reset by outputs from the operational amplifiers Amp.

At time t1, the signal ϕRES shifts to low level. The resetting unit RES is brought out of conduction, and the gate terminal of the pixel outputting unit SF is released from the reset state. A noise component caused by the release from the reset state contributes to a pixel noise n.

At time t2, the signals φC1, φC2, φC3, φC4, φCTN, and φCTS shift to low level, and switches corresponding to the signals are brought out of conduction.

A shift of the signal φC to low level at time t3 releases each operational amplifier from the short-circuited state between the input and output terminals. A level corresponding to the resetting of the gate terminal of the pixel outputting unit SF is clamped by the power supply potential Vref at each input capacitor C0.

The signals φC1 and φCTN change to high level at time t4, and the signal φCTN changes to low level at time t5. The shifts cause an output from the column amplifying unit 102-1 at the time to be held in the holding capacitor CTN1 and an output from the column amplifying unit 102-2 at the time to be held in the holding capacitor CTN2. The signals held by the holding capacitors CTN1 and CTN2 include an offset component originating in the corresponding column amplifying unit 102.

When the signal φTX shifts to high level at time t6, electric charges accumulated in a photodiode PD are transferred to the gate terminal of the pixel outputting unit SF. Since the potential at the gate terminal of the pixel outputting unit SF changes, a level appearing on the vertical signal line VL changes. At the time, each input capacitor C0 is in a floating state, and only a difference from the level on the vertical signal line VL clamped at time t1 is input to the inversion input terminal of the corresponding operational amplifier Amp. That is, a noise component generated upstream of the clamp capacitor can be reduced by a clamp operation, and a signal based on a photoelectric conversion is input to the operational amplifiers Amp.

The signal φCTS remains at high level in a pulse shape from time t7. When the signal φCTS changes to low level, the switches are turned off, and a signal output from the column amplifying unit 102-1 and a signal output from the column amplifying unit 102-2 are held in the holding capacitors CTS1 and CTS2, respectively. The signals held by the holding capacitors CTS1 and CTS2 include an offset component originating in the corresponding column amplifying unit 102, as in the holding capacitors CTN1 and CTN2.

After the signals φC1 and φC3 shift to low level, the signal φSEL changes to low level at time t8. The shift brings the pixel selecting unit SEL out of conduction and releases the pixel 101 from a selected state.

The signals φHn change to high level successively from time t9, and signals are output from the pixels 101 in one row via differential amplifiers D. Amp1 and D. Amp2. Each differential amplifier D. Amp1 subtracts an offset signal at the holding capacitor CTN1 from the pixel signal at the holding capacitor CTS1 to output a pixel signal S1 after the removal of an offset. The differential amplifier D. Amp2 subtracts an offset signal at the holding capacitor CTN2 from the pixel signal at the holding capacitor CTS2 to output a pixel signal S2 after the reduction by an offset. Since the signals held by the holding capacitors CTS1, CTS2, CTN1, and CTN2 include an offset originating in the column amplifying unit 102, an offset component can be reduced by obtaining a difference by the differential amplifiers D. Amp1 and D. Amp2. The signal S1 amplified at a gain of 1 is output from the differential amplifier D. Amp1, and the signal S2 amplified at a gain of 8 is output from the differential amplifier D. Amp2. The signals S1 and S2 include an output noise N as described above.

In the present embodiment, provision of a multiple column amplifying unit 102 for each column enables the pixels in one row to be processed in parallel. That is, the column amplifying unit 102 can be driven at a lower speed than the speed of the output amplifiers 1042 and has the advantage of being unlikely to become a noise source.

The present embodiment enables an increase in the dynamic range of the solid-state imaging device 1 and an improvement in the S/N ratio of the solid-state imaging apparatus. A favorable image can be obtained by performing a multiplication by a γ value corresponding to a gain of the column amplifying unit 102 in the DSP 23. Since the plurality of column amplifying units 102-1 and 102-2 with different gains is provided for each vertical signal line VL, the present embodiment has the advantage of the ability to perform parallel processing. That is, the present embodiment is suited for a high speed operation.

Figure 8:
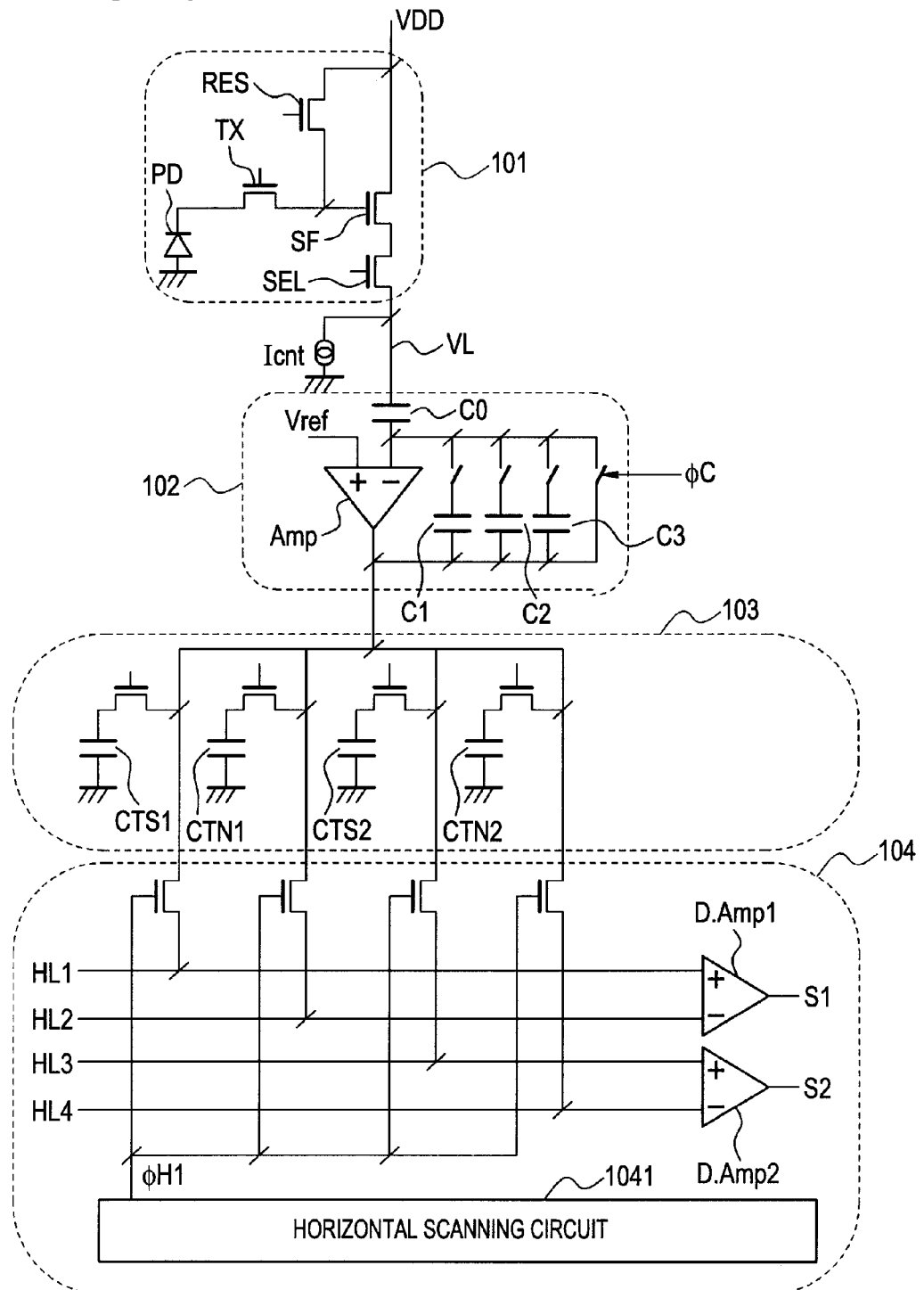
FIG. 8 is a schematic circuit diagram of one column amplifying unit according to an example of the present invention.

An example will be described with reference to FIG. 8 in which one column amplifying unit 102 is provided for each pixel 101 in FIG. 5 in the solid-state imaging device 1 according to the first embodiment of the present invention. FIG. 8 illustrates a schematic circuit diagram of the one column amplifying unit 102 according to the present example. Each pixel 101 includes the photodiode PD which is a photoelectric conversion element and a transferring unit TX which transfers electric charges accumulated in the photodiode PD to a gate terminal of a MOS transistor constituting the pixel outputting unit SF. The gate terminal which is an input portion of the pixel outputting unit SF is connected to a power supply VDD via the resetting unit RES. A source terminal of the pixel outputting unit SF is connected to one terminal of the input capacitor C0 of the column amplifying unit 102 and to the constant current source Icnt via the pixel selecting unit SEL.

The column amplifying unit 102 includes the operational amplifier Amp. An inversion input terminal of the operational amplifier Amp is connected to the other terminal of the input capacitor C0. The feedback capacitors C1, C2, and C3 are provided so as to connect the inversion input terminal and an output terminal of the operational amplifier Amp via switches. A switch for short-circuiting the inversion input terminal and output terminal of the operational amplifier Amp is further provided. The power supply potential Vref is applied to a non-inversion input terminal of the operational amplifier Amp. A signal output from the pixel 101 to the vertical signal line VL is amplified at a gain which is determined by the ratio of the capacitance value of the feedback capacitors C1, C2, and C3 connected to a feedback path of the operational amplifier Amp to the capacitance value of the input capacitor C0. The capacitance values of the feedback capacitors C1, C2, and C3 are assumed to be 1 times, ⅛ times, and ¹⁄₁₆ times, respectively, the capacitance value of the input capacitor C0. That is, in the present embodiment, the column amplifying circuit 102 with a variable gain is provided. As will be described later, noise originating in the pixel 101 is reduced by the input capacitor C0. The input capacitor C0, operational amplifier Amp, and the switch to which a signal φC is input will be collectively referred to as a first CDS circuit.

A signal amplified by the column amplifying unit 102 is selectively transmitted to and held in the holding capacitors CTS1, CTN1, CTS2, and CTN2. The holding capacitors CTS1 and CTS2 hold signals based on electric charges obtained by a photoelectric conversion in the photodiode PD, and the holding capacitors CTN1 and CTN2 hold signals based on resetting of the pixel outputting unit SF. The holding capacitors CTS1, CTN1, CTS2, and CTN2 are connected to different horizontal lines HL1 to HL4, respectively. The signals held by the holding capacitors CTS1 and CTN1 are connected to different input terminals of the differential amplifier D. Amp1 via switches, respectively. The signals held by the holding capacitors CTS2 and CTN2 are connected to different input terminals of the differential amplifier D. Amp2 via switches, respectively. When signals φH1, φH2, . . . are input from the horizontal scanning circuit 1041, the signals held by the holding capacitors CTS1, CTN1, CTS2, and CTN2 are input to the corresponding differential amplifiers D. Amp1 and D. Amp2 via the horizontal signal lines HL1 to HL4. A difference between the signals held by the holding capacitors CTS1 and CTN1 is output from the differential amplifier D. Amp1. A difference between the signals held by the holding capacitors CTS2 and CTN2 is output from the differential amplifier D. Amp2. The holding capacitors CTS1, CTN1, CTS2, and CTN2 and differential amplifiers D. Amp1 and D. Amp2 will be collectively referred to as a second CDS circuit. The second CDS circuit reduces an offset originating in the column amplifying unit 102.

Figure 9:
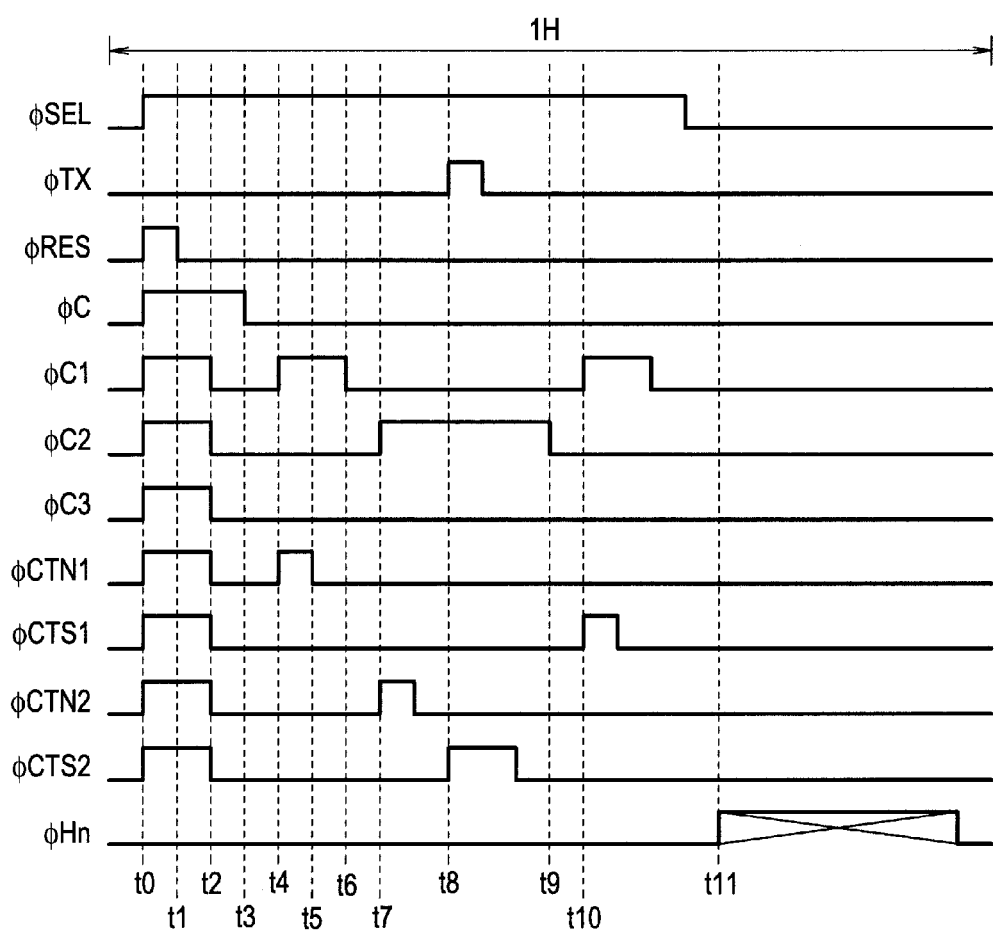
FIG. 9 is a schematic timing chart according to the example in FIG. 8.

Operation according to the present example will be described with reference to FIG. 9, which is a schematic timing chart of the example in FIG. 8. Assume here that the feedback capacitors C1 and C2 are used and that the capacitance values of the feedback capacitors C1 and C2 are 1 times and ⅛ times, respectively, the capacitance value of the input capacitor C0. That is, a case will be described where one signal is amplified at a gain of 1 and at a gain of 8. In FIG. 8, signals which are input to switches indicated by TX, RES, and SEL are signals φTX, φRES, and φSEL, and the switches are in conduction when the signals are at high level. Signals which are supplied to the switches present between the feedback capacitors C1, C2, and C3 and the inversion input terminal of the operational amplifier Amp are signals φC1, φC2, and φC3, and the switches are in conduction when the signals are at high level. Signals which are supplied to switches present between the holding capacitors CTS1, CTN1, CTS2, and CTN2 and an output terminal of the column amplifying unit 102 are signals φCTS1, φCTN1, φCTS2, and φCTN2, and the switches are in conduction when the signals are at high level.

First, at time t0, all signals except for the signals φTX and φHn shift to high level. When the signal φSEL changes to high level, the pixel selecting unit SEL is brought into conduction. The source terminal of the pixel outputting unit SF and the constant current source Icnt are electrically connected to form a source follower circuit. The formation causes a level corresponding to the potential of the gate terminal of the pixel outputting unit SF to appear as a signal on the vertical signal line VL. Since the signal φRES is at high level at this time, the resetting unit RES is brought into conduction, and a level corresponding to a state in which the gate terminal of the pixel outputting unit SF is reset appears on the vertical signal line VL. In addition, the signals φC, φC1, φC2, and φC3 change to high level, which causes the inversion input terminal and output terminal of the operational amplifier Amp to be short-circuited and the feedback capacitors C1, C2, and C3 to be reset. Because of a virtual ground phenomenon in the operational amplifier Amp, the potentials of the terminals of the feedback capacitors C1 and C2 can be regarded as the same potential as the power supply potential Vref. Since the signals φCTN1, φCTS1, φCTN2, and φCTS2 are at high level, the corresponding switches are brought into conduction, and the holding capacitors CTN1, CTS1, CTN2, and CTS2 are reset by an output from the operational amplifier Amp.

At time t1, the signal φRES shifts to low level. The resetting unit RES is brought out of conduction, and the gate terminal of the pixel outputting unit SF is released from the reset state. A noise component caused by the release from the reset state contributes to a pixel noise n.

At time t2, the signals φC1, φC2, φC3, φCTN1, φCTS1, φCTN2, and φCTS2 change to low level, and the switches corresponding to the signals are brought out of conduction.

After that, a shift of the signal φC to low level at time t3 releases the operational amplifier from the short-circuited state between the input and output terminals. A level corresponding to the resetting of the gate terminal of the pixel outputting unit SF is clamped by the power supply potential Vref at the input capacitor C0.

The signals φC1 and φCTN1 change to high level at time t4, and the signal φCTN1 changes to low level at time t5. The shifts cause an output from the column amplifying unit 102 at the time to be held in the holding capacitor CTN1. Since the signal φC1 is at high level, only the feedback capacitor C1 is electrically connected to the period path of the operational amplifier Amp. That is, the gain of the column amplifying unit 102 is C0/C1=C0/C0=1. A signal held by the holding capacitor CTN1 includes an offset component originating in the column amplifying unit 102.

The signal φC1 shifts to low level at time t6, and the signal φC2 shifts to high level at time t7. With the shifts, only the feedback capacitor C2 is electrically connected to the feedback path of the operational amplifier Amp. That is, the gain of the column amplifying unit 102 is C0/C2=C0/(C0/8)=8.

The signal φCTN2 remains at high level in a pulse shape from time t7. When the signal φCTN2 changes to low level, a signal including an offset component originating in the column amplifying unit 102 is held in the holding capacitor CTN2.

When the signal φTX shifts to high level at time t8, electric charges accumulated in the photodiode PD are transferred to the gate terminal of the pixel outputting unit SF. Since the potential at the gate terminal of the pixel outputting unit SF changes, a level appearing on the vertical signal line VL changes. At the time, the input capacitor C0 is in a floating state, and only a difference from the level on the vertical signal line VL clamped at time t1 is input to the inversion input terminal of the operational amplifier Amp. That is, of noise components generated upstream of the clamp capacitor, a noise component having a correlation between the level on the vertical signal line VL at time t3 and the level at time t8 or later can be reduced by a clamp operation. Accordingly, a signal based on a photoelectric conversion is input to the operational amplifier Amp. Since fluctuations in current flowing through the constant current source Icnt, noise referred to as 1/f noise generated in the pixel outputting unit SF, and the like are different between time t1 and time t8 (have no correlation with each other), the fluctuations, noise, and the like cannot be reduced by a clamp operation. In the present embodiment, the noise component without correlation corresponds to the pixel noise n.

Only the feedback capacitor C2 having a capacitance value ⅛ times the capacitance value of the input capacitor C0 is present in the feedback path of the operational amplifier Amp at time t8, and a signal based on a photoelectric conversion is amplified at a gain of 8. The signal CTS2 remains at high level in a pulse shape from time t8, and a shift of the signal φCTS2 to low level causes a signal amplified at a gain of 8 by the column amplifying unit 102 to be held in the holding capacitor CTS2. The signal held by the holding capacitor CTS2 includes an offset originating in the column amplifying unit 102, as is the case with the holding capacitor CTN2.

The signal φC2 shifts to low level at time t9, and the signal φC1 shifts to high level at time t10. With the shifts, only the feedback capacitor C1 is electrically connected to the feedback path of the operational amplifier Amp. Since the capacitance value of the feedback capacitor C1 is equal to the capacitance value of the input capacitor C0, a signal input to the column amplifying unit 102 is amplified at a gain of 1.

The signal φCTS1 changes to high level at time t10. When the signal φCTS1 shifts to low level, a signal obtained by amplifying a level appearing on the vertical signal line VL at a gain of 1 is held in the holding capacitor CTS1. The signal held by the holding capacitor CTS1 includes an offset originating in the column amplifying unit 102 as is the case with the holding capacitor CTN1.

After that, the signal φSEL changes to low level, which brings the pixel selecting unit SEL out of conduction and releases the pixel 101 from a selected state.

The signals φHn change to high level successively from time t11, and signals are output from the pixels 101 in one row via the differential amplifiers D. Amp1 and D. Amp2. Since the signals held by the holding capacitors CTS1, CTN1, CTS2, CTN2 include an offset originating in the column amplifying unit 102, an offset component can be reduced by obtaining a difference by the differential amplifiers D. Amp1 and D. Amp2. The signal S1 amplified at a gain of 1 is output from the differential amplifier D. Amp1, and the signal S2 amplified at a gain of 8 is output from the differential amplifier D. Amp2. The signals S1 and S2 include an output noise N as described above.

The column amplifying unit 102 successively amplifies a first signal G1 and a second signal G8 with the identical column amplifying unit and outputs the signals. In the present embodiment, the provision of a multiple column amplifying unit 102 for each column enables the pixels 101 in one row to be processed in parallel. That is, the column amplifying unit 102 can be driven at a lower speed than the speed of the output amplifiers 1042 and has the advantage of being unlikely to become a noise source.

Figure 10:
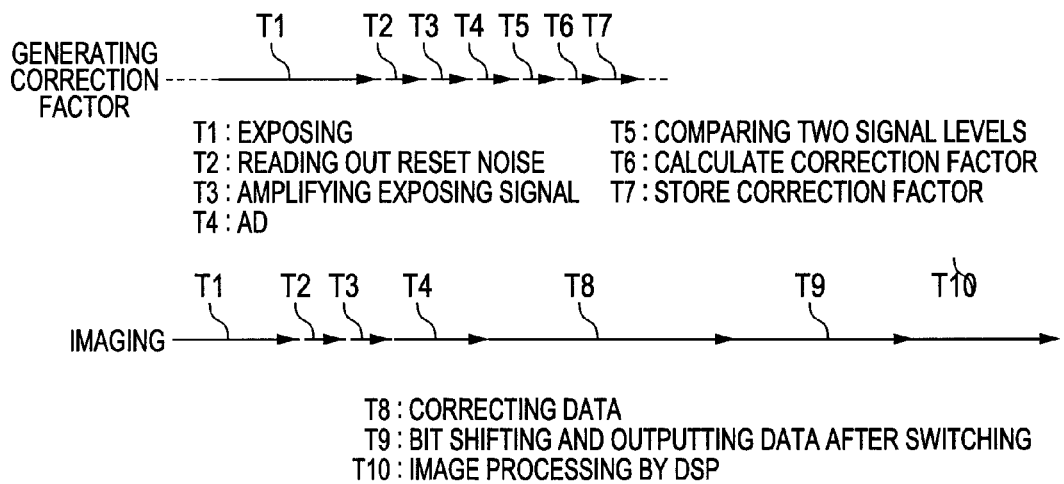
FIG. 10 is a chart for describing the imaging timing for the solid-state imaging apparatus according to the first embodiment.

Operation of the solid-state imaging apparatus according to the first embodiment of the present invention will be described. FIG. 10 is a chart for describing the imaging timing for the solid-state imaging apparatus according to the first embodiment. A process of imaging an object for forming a gain error correction signal and generating a correction factor K will be described first. During a period T1, exposing is performed. During a period T2, a reset signal for each pixel 101 is read out, and the reset signal is clamped at an input portion of the column amplifying unit 102. During a period T3, an exposing signal at the pixel 101 is read out, and a CDS operation in the CDS circuits ends. Signals obtained through the CDS operation are output to outside the solid-state imaging device 1. During a period T4, the AD converting units 21 convert the signals from an analog signal to a digital signal. By the signal processing described with reference to FIG. 3, the comparing unit 224 compares the levels of the two signals during a period T5, generates a correction factor K based on a gain error ΔV during a period T6, and stores the correction factor K in the correction data memory unit 225 during a period T7. By a similar operation, a correction factor K for each combination of gains is held in a camera.

A process at the time of imaging will be described. During the periods T1 to T4, the same series of operation is performed as in the generation of a correction factor K. After that, during a period T8, the correction unit 226 corrects a signal DATA2 using a stored correction factor. During a period T9, switching between a signal DATA1 and the signal DATA2 is performed by the switching flag φb to output a 15-bit digital signal DATA3. As described above, pixel signals are successively read out from the pixel unit 10 of the solid-state imaging device 1, the correction unit 226 corrects gain errors based on correction factors K, and bit switching is performed (the periods T2 to T4, T8, and T9). With the operations, image data is obtained. During a period T10, the DSP 23 performs signal processing of the corrected signal DATA3 and records the resulting signal on the recording unit 3. With the imaging timing, wide-dynamic signals with a difference in level in an image hard to visually recognize are recorded. With the above-described configuration, a gain error in each column amplifying unit when signals amplified at different gains are obtained and/or a conversion error in each analog to digital converting unit can be reduced.

Second Embodiment

A second embodiment of the present invention will be described. In the first embodiment, an object for correction signal formation is imaged, and a gain error is detected. Each column amplifying unit 102 or memory unit 103 has an offset noise with a fixed pattern and a gain error due to semiconductor process variation, which leads to a degradation in image performance. The second embodiment of the present invention has as an object to eliminate the above-described noise and omit imaging of an object for correction signal formation by inputting a reference signal to each vertical signal line VL. Differences between the present embodiment and the first embodiment will be described below.

Figure 11:
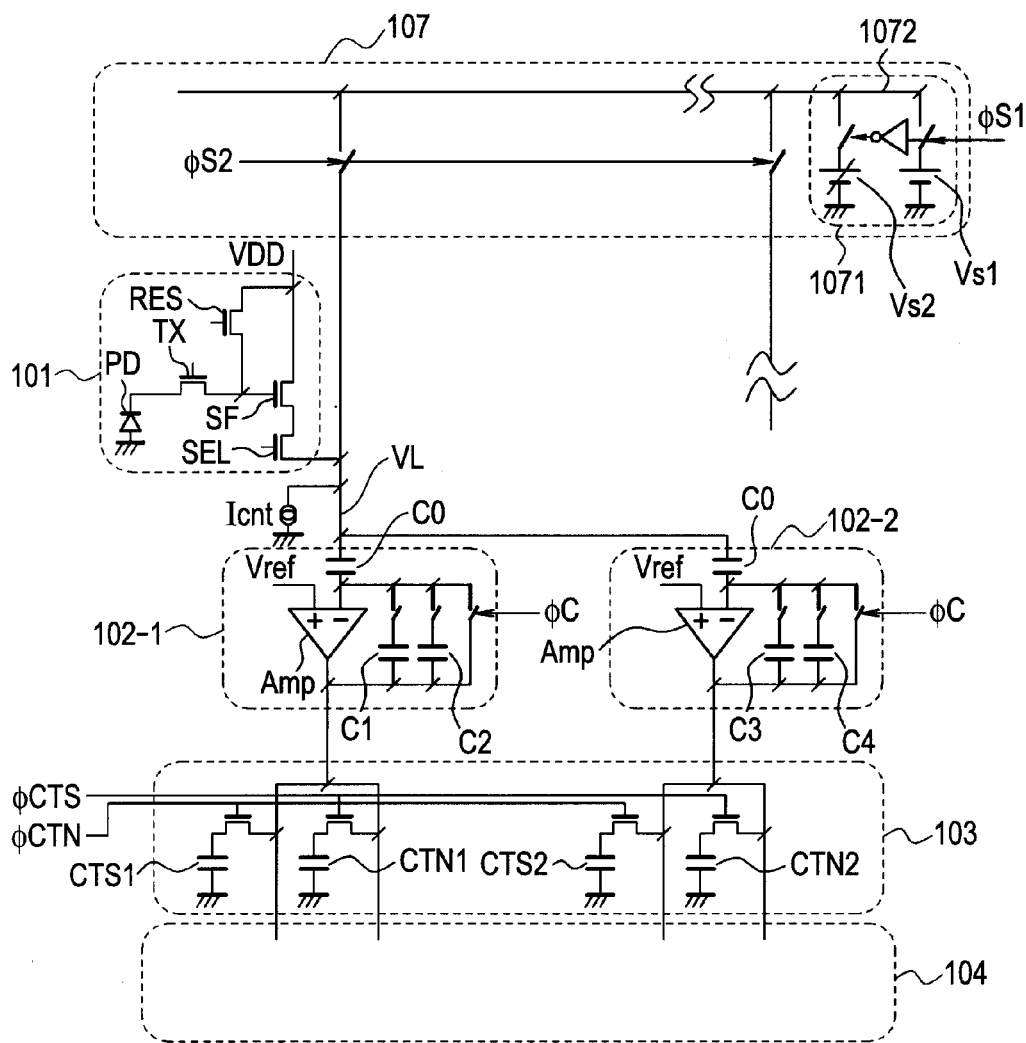
FIG. 11 is a diagram illustrating the schematic configuration of a reference signal input circuit according to a second embodiment.

FIG. 11 illustrates the schematic configuration of a solid-state imaging device 1 including a reference signal input circuit (reference signal input unit) 107 according to the second embodiment of the present invention. A column amplifying unit 102 includes column amplifying units 102-1 and 102-2. Each vertical signal line VL is connected to a reference signal line 1072 of the reference signal input circuit 107 via a switch which is controlled by a pulse φS2. The reference signal input circuit 107 brings the switches controlled by the pulse φS2 into conduction and controls switches which are controlled by a pulse φS1, prior to imaging (or when the power for photographing is turned on). With this configuration, a reference signal with an amplitude corresponding to an imaging sensitivity is input to detect a gain error and an offset noise in a downstream signal processing system. The reference signal input circuit 107 includes a signal source 1071 having two power supply voltages Vs1 and Vs2, which selectively outputs the reference signal voltages Vs1 and Vs2 to each vertical signal line VL. The power supply voltage Vs2 is variably controlled. The signal source 1071 controls conduction/nonconduction of the switches with the pulse φS1, which generates a signal of Vs1−Vs2 in the reference signal line 1072 for each vertical signal line VL. The signal of Vs1−Vs2 is set to have a signal level not more than a signal level VH(b) when the signal is amplified at a high gain by the column amplifying unit 102.

The reference signal voltage Vs1 is a potential corresponding to the reset level for a pixel 101, and the reference signal voltage Vs2 is a potential corresponding to an exposing signal from each pixel 101. By performing the CDS processing described with reference to FIGS. 6 and 8 and gain processing in each column amplifying unit 102, a gain error between different gains can be detected. If the power supply Vs2 is prepared using a digital to analog (DA) converting unit, the signal level of the signal of Vs1−Vs2 can be easily changed to a signal level corresponding to each gain of each column amplifying unit 102. If each column amplifying unit 102 has a large gain, the reference signal voltage Vs2 needs to be made very low such that the reference signal level is not saturated. The DA converting unit can easily generate such a low potential. As described above, since a gain error can be detected with the reference signal input circuit 107 with a very simple configuration, gain error detection prior to imaging is very effective.

The imaging timing for a solid-state imaging apparatus according to the present embodiment will be described with reference to FIG. 14. A process of generating a correction factor K will be described first. During a period T1, the power to the solid-state imaging apparatus is turned on. During a period T2, the reference signal input circuit 107 outputs the reference signal voltage Vs1 corresponding to a reset signal for each pixel 101 to the vertical signal line VL. During a period T3, the reference signal input circuit 107 outputs the reference signal voltage Vs2 corresponding to an exposing signal at the pixel 101 to the vertical signal line VL. The column amplifying unit 102 amplifies a reference signal of Vs1−Vs2 at a first gain and at a second gain and outputs a first signal G1 and a second signal G8. During a period T4, AD converting units 21 convert the first and second signals G1 and G8 from an analog signal to a digital signal. By the signal processing in FIG. 3, a comparing unit 224 compares the levels of the two signals during a period T5, generates a correction factor K based on a gain error ΔV during a period T6, and stores the correction factor K for each column and for each gain error in a correction data memory unit 225 during a period T7. As described above, when the power is turned on, each column amplifying unit 102 outputs the first and second signals G1 and G8 obtained by amplifying the reference signal of Vs1−Vs2, the comparing unit 224 detects the gain error ΔV between a third signal G8# and the first signal G1 and generates the correction factor K.

A process at the time of imaging will be described. When an imaging system is produced on a production site such as a factory or when correction factors at initialization of an imaging system are acquired, a series of operations similar to the series of operations with the imaging timing described with reference to FIG. 10 is performed. On the other hand, when correction factors are updated each time imaging is performed, the correction factors are calculated before the start of exposing during the period T1 immediately after the power to an imaging system is turned on and are held in the memory. During the period T2 or later, operation is performed with the same timing as the timing in FIG. 10.

As described above, the plurality of pixels 101 are arranged in a matrix to generate signals by photoelectric conversions. The reference signal input circuit 107 generates a reference signal of Vs1−Vs2. The column amplifying unit 102 is provided for each column of the plurality of pixels 101 to output a first signal G1 that is obtained by amplifying one of a signal at each of corresponding ones of the plurality of pixels 101 and the reference signal Vs1−Vs2 at a first gain and a second signal G8 that is obtained by amplifying the signal at a second gain larger than the first gain. The AD converting units 21 convert the first and second signals G1 and G8 from an analog signal to a digital signal. The comparing unit 224 detects a gain error ΔV between a third signal G8# that is obtained by level-shifting the second signal G8 into the same gain level as the gain level of the signal G1 and the first signal G1 when the column amplifying unit 102 outputs the first and second signals G1 and G8 obtained by amplifying the reference signal Vs1−Vs2. The correction unit 226 corrects the first signal G1 and one of the second signal G8 and the third signal G8# based on the gain error ΔV when the column amplifying unit 102 outputs the first and second signals G1 and G8 obtained by amplifying the signal at each of the plurality of pixels 101. With the above-described configuration, a gain error in each column amplifying unit when signals amplified at different gains are obtained and/or a conversion error in each analog to digital converting unit can be reduced.

Third Embodiment

Figure 12:
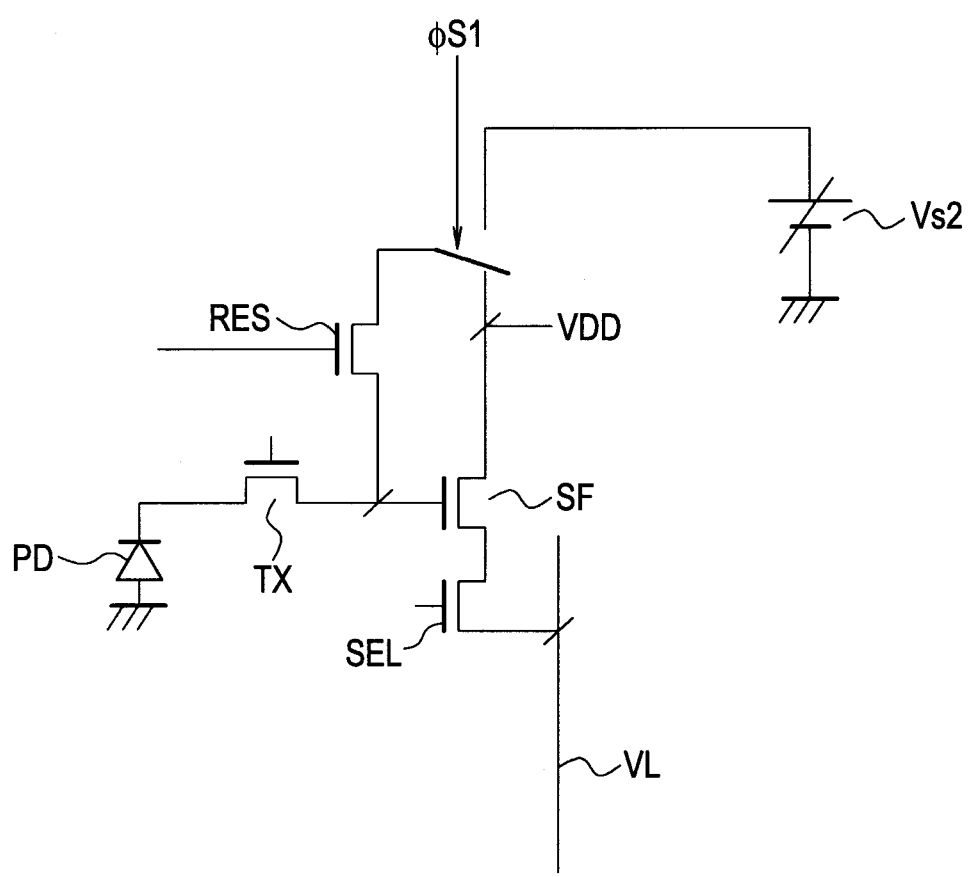
FIG. 12 is a diagram illustrating the schematic configuration of a reference signal input circuit according to a third embodiment.

A third embodiment of the present invention will be described. FIG. 12 is a diagram illustrating the schematic configuration of a pixel 101 including a reference signal input circuit according to the third embodiment of the present invention. In the second embodiment (FIG. 11), a gain error in the column amplifying unit 102 or the like is detected using a reference signal from the reference signal input circuit 107. In the present embodiment, each pixel 101 includes a reference signal input circuit which outputs a reference signal. Differences between the present embodiment and the second embodiment will be described below. A switch connects a reset switch RES to one of a node at a power supply potential VDD and a node at a reference potential Vs2 according to a signal φS1. At the time of reset, the reset switch RES is connected to the node at the power supply VDD, and a gate terminal of a pixel outputting section SF is reset with the power supply potential VDD. In contrast, at the time of reference signal reading, an electric charge obtained by exposing in a photodiode PD is not supplied. The reset switch RES is connected to the node at the reference potential Vs2, and the reference potential Vs2 is supplied to the gate terminal of the pixel outputting section SF instead. The reference potential is output to a vertical signal line VL. A power supply for the reference potential Vs2 may be a DA converting unit. As described above, an error in each column amplifying unit 102, AD converting units 21, and the like is detected by inputting a reference signal from a pixel unit 10. Correction of the error enables acquisition of a good image.

As described above, each pixel 101 includes the photodiode (photoelectric conversion element) PD, a transfer switch TX, and the field-effect transistor SF. The photodiode PD generates a signal by a photoelectric conversion. The transfer switch TX is connected to the photoelectric conversion element PD. The field-effect transistor SF has a gate connected to the photodiode PD via the transfer switch TX, a drain connected to the node at the power supply potential VDD, and a source which outputs a signal to the column amplifying unit 102 via a pixel selecting unit SEL. The reference signal input circuit includes the switch for the power supply for the reference potential Vs2 and the control signal φS1 and selectively outputs reference signals Vs2 and VDD to the gate of the field-effect transistor SF. Supply of the reference signal VDD to the gate of the field-effect transistor SF corresponds to supply of the reference signal voltage Vs1 in the second embodiment. Supply of the reference signal Vs2 to the gate of the field-effect transistor SF corresponds to supply of the reference signal voltage Vs2 in the second embodiment. Operation according to the present embodiment is the same as the operation according to the second embodiment. With the above-described configuration, a gain error in each column amplifying unit when signals amplified at different gains are obtained and/or a conversion error in each analog to digital converting unit can be reduced.

Fourth Embodiment

Figure 13:
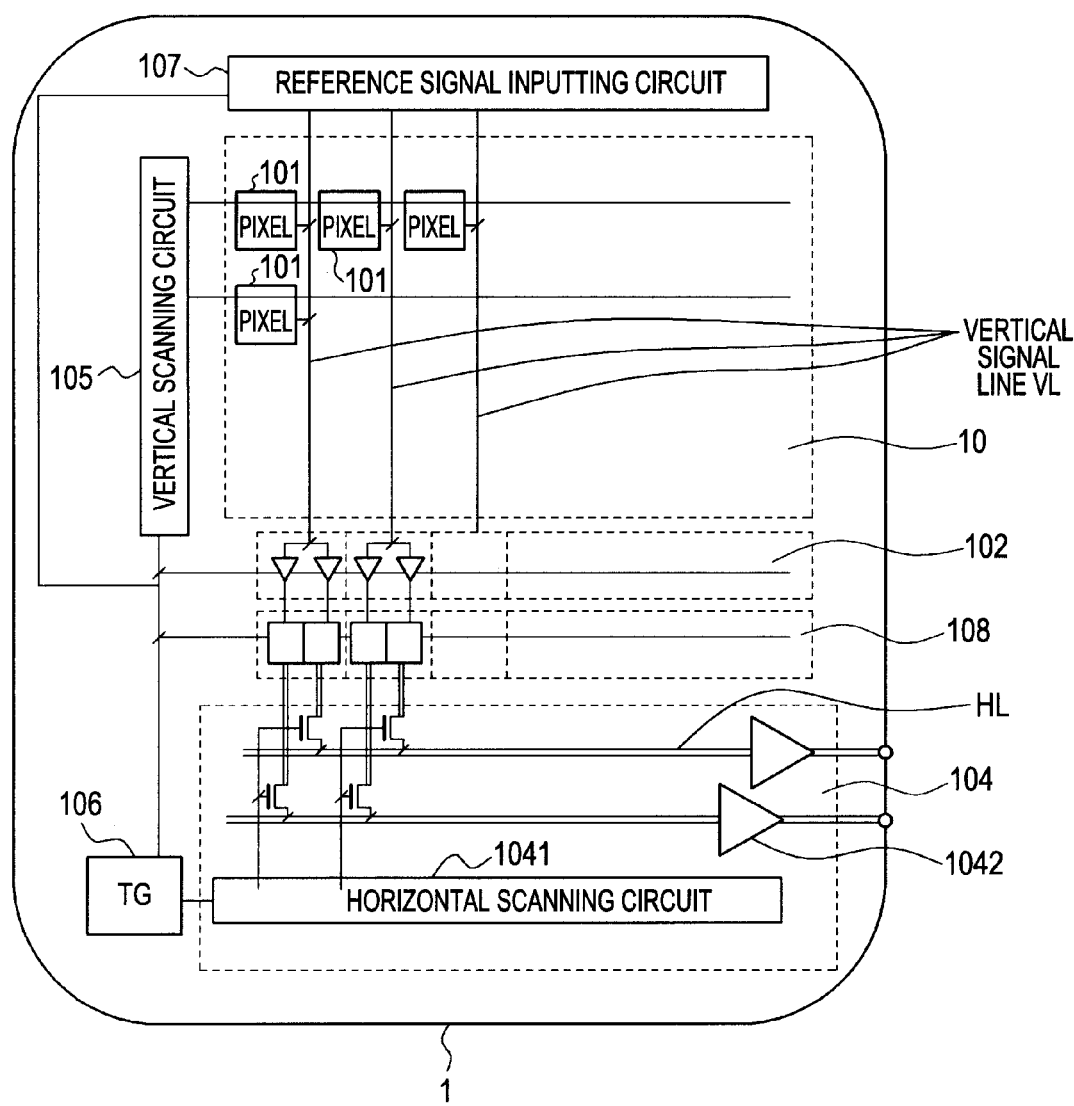
FIG. 13 is a diagram illustrating the schematic configuration of a solid-state imaging device according to the second embodiment.

FIG. 13 is a diagram illustrating the schematic configuration of a solid-state imaging device 1 according to a fourth embodiment of the present invention. The present embodiment is obtained by adding an AD converting unit 108 downstream of a column amplifying unit 102 and a reference signal input circuit 107 as in the embodiment in FIG. 11 to the first embodiment in FIG. 5. Differences between the present embodiment and the second embodiment will be described below. In each AD converting unit 108, amplifying units of the column amplifying unit 102 convert output signals from an analog signal to a digital signal. The AD converting unit 108 converts a first signal G1 and a second signal G8 with different AD converting units from an analog signal to a digital signal. The provision of the AD converting unit 108 for each of two gain signals from the column amplifying unit 102 in the solid-state imaging device 1 enables higher processing. The bit processing unit 22 according to the embodiment in FIG. 3 is used as a bit processing unit 22 (FIG. 2) according to the fourth embodiment. The gains of each column amplifying unit 102 are set in photographic sensitivity setting, the level of a reference signal is set according to the gains, and the reference signal is input. Accordingly, at the time of gain error detection, the comparing level determination unit 222 (FIG. 3) is unnecessary. A timing generating unit (TG) 24 controls a comparing unit 224. In actual imaging, the timing generating unit 24 operates as a comparing level determination unit 222 for a signal DATA2 (G8). Even if the AD converting unit 108 with a somewhat large gain error is provided within the solid-state imaging device 1, inputting of a reference signal enables accurate detection and correction of a signal error in the column amplifying unit 102 and AD converting unit 108.

Figure 14:
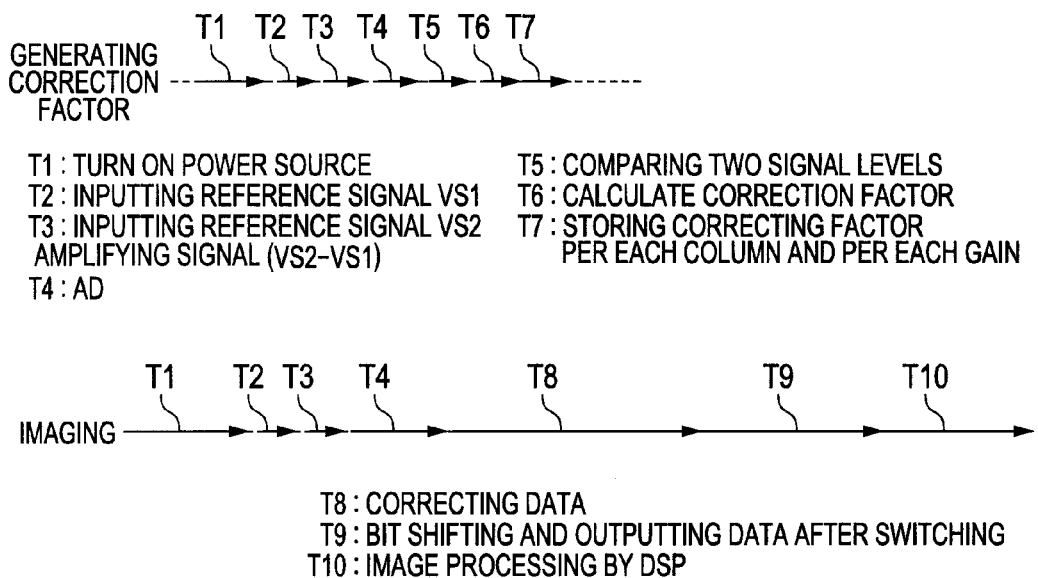
FIG. 14 is a chart for describing the imaging timing for a solid-state imaging apparatus according to the second embodiment.

FIG. 14 is a chart for describing the imaging timing for a solid-state imaging apparatus according to the present embodiment. Differences between a method for generating a correction factor K according to the present embodiment and the second embodiment will be described. During a period T4, each AD converting unit 108 converts a first signal G1 and a second signal G8 from an analog signal to a digital signal. By the signal processing in FIG. 3, the comparing unit 224 compares the levels of the two signals during a period T5, generates a correction factor K based on a gain error ΔV during a period T6, and stores the correction factor K for each column and for each gain error in a correction data memory unit 225 during a period T7. The timing for imaging is the same as the timing in the second embodiment. With the above-described configuration, a gain error in each column amplifying unit when signals amplified at different gains are obtained and/or a conversion error in each analog to digital converting unit can be reduced.

Fifth Embodiment

Figure 15:
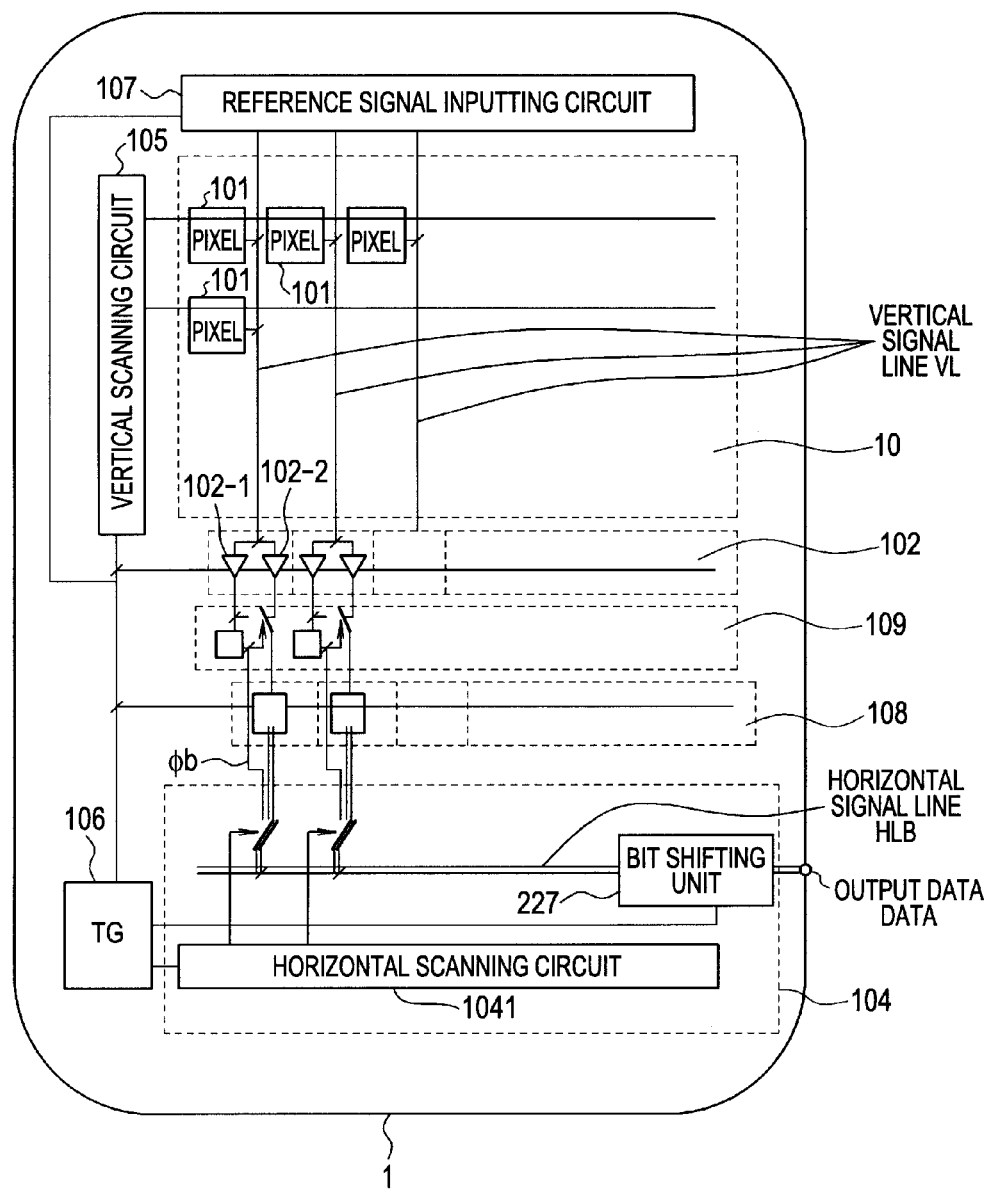
FIG. 15 is a diagram illustrating the schematic configuration of a solid-state imaging device according to a fourth embodiment.

FIG. 15 is a diagram illustrating the schematic configuration of a solid-state imaging device 1 according to a fifth embodiment of the present invention. A feature of the present embodiment lies in that one AD converting unit 108 is provided for each pixel column, unlike the fourth embodiment (FIG. 13). Differences between the present embodiment and the fourth embodiment will be described below. A column amplifying unit 102 includes a column amplifying unit 102-1 which outputs a first signal G1 with a low gain and a column amplifying unit 102-2 which outputs a second signal G8 with a high gain and amplifies and outputs the first and second signals G1 and G8 with the different column amplifying units 102-1 and 102-2. A signal selecting unit 109 selects one of the first signal G1 with the low gain and the second signal G8 with the high gain by switch control. The AD converting unit 108 converts the one of the first and second signals G1 and G8 selected by the signal selecting unit 109 from an analog signal to a digital signal. The signal selecting unit 109 selects the second signal G8 when the second signal G8 is not more than a first signal level VH(b) and selects the first signal G1 when the second signal G8 is more than the first signal level VH(b).

Note that the signal selecting unit 109 may select the second signal G8 when the second signal G8 is less than the first signal level VH(b) and selects the first signal G1 when the second signal G8 is not less than the first signal level VH(b). The AD converting unit 108 successively converts one of a first signal G1 and a second signal G8 from an analog signal to a digital signal with an identical AD converting unit. The signal selecting unit 109 transfers a selection signal φb as in FIG. 3 to a horizontal signal line HLB via the AD converting unit 108 in parallel with a digital signal described above. The selection signal φb is a signal indicating which one of a first signal G1 and a second signal G8 is selected. As in the first embodiment, the selection signal φb is at low level when a first signal G1 is selected and is at high level when a second signal G8 is selected. A bit switching unit 227 is provided on the horizontal signal line HLB. One of a first signal G1 and a second signal G8 is transferred from the AD converting unit 108 and signal selecting unit 109 to the horizontal signal line HLB together with the selection signal φb according to a pixel signal level for each column and is output to the bit switching unit 227. The bit switching unit 227 has the same configuration as the configuration of the bit switching unit 227 in FIG. 4 and operates in the same manner. That is, the bit switching unit 227 selects a second signal G8 and outputs a high-gain signal when the selection signal φb is at high level and outputs a first signal G1 as a low-gain signal when the selection signal φb is at low level. The solid-state imaging device 1 outputs the selection signal φb together with one of a low-gain signal and a high-gain signal. The selection signal φb may be transferred in parallel with one of a first signal G1 and a second signal G8 or may be serially transferred. A bit processing unit 22-1 (to be described later) (FIG. 16) detects a gain error ΔV in data output from the bit switching unit 227 and corrects the data.

Note that each column amplifying unit 102 may successively amplify and output a first signal G1 and a second signal G8 with an identical column amplifying unit, as illustrated in FIG. 8. In the case, the column amplifying unit 102 outputs a second signal G8 amplified at a high gain first and a first signal G1 amplified at a low gain second. The signal selecting unit 109 selects a signal to be AD-converted by determining the signal level of the second signal G8. Since signal level determination is performed using a second signal amplified at a high gain, a circuit for determining a signal level is not necessarily required to have high accuracy.

According to the present embodiment, the number of AD converting units in each AD converting unit 108 is reduced by half. The reduction leads to a reduction in the size of the solid-state imaging device 1 and a reduction in power consumption. Since the number of pieces of data from the AD converting unit 108 can be reduced by half, the number of terminals in a package of the solid-state imaging device 1 can also be reduced. The present embodiment is thus cost-effective.

Figure 16:
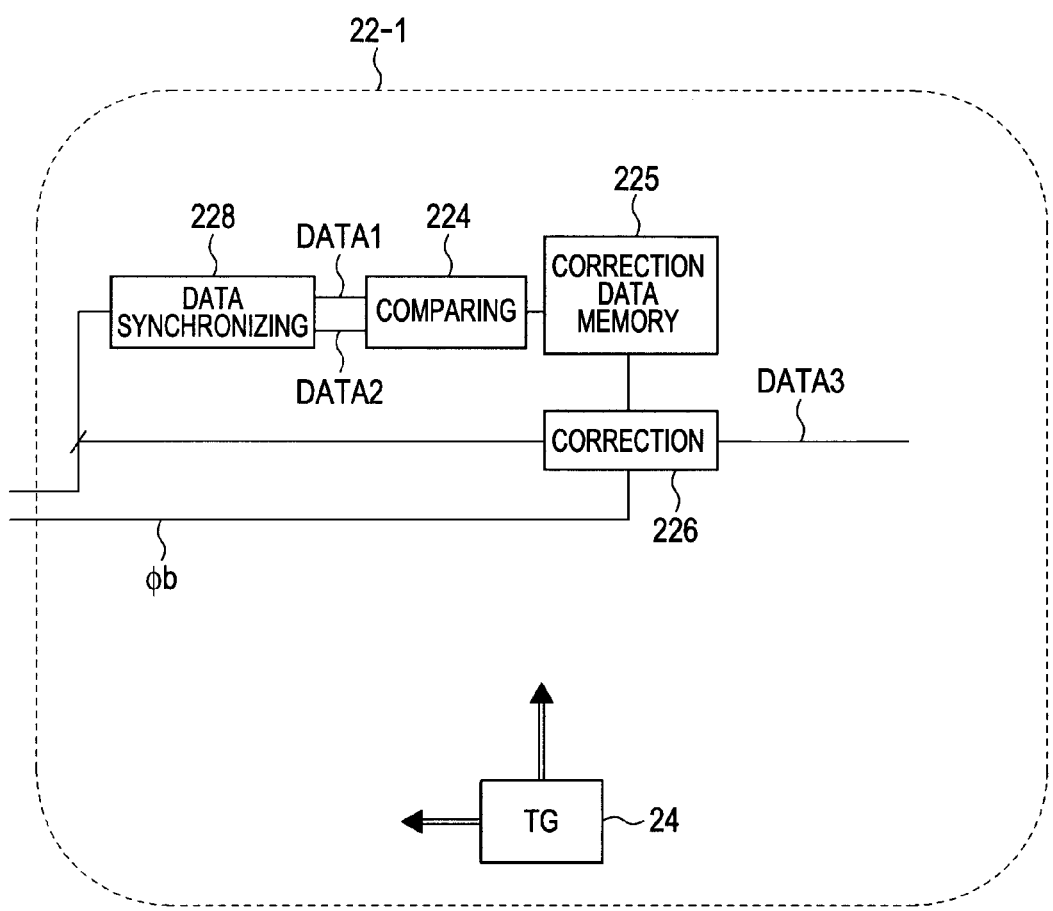
FIG. 16 is a diagram illustrating the schematic configuration of a bit processing unit according to a fifth embodiment.

FIG. 16 is a diagram illustrating the schematic configuration of the bit processing unit 22-1 according to the fifth embodiment of the present invention. The bit processing unit 22-1 is provided instead of the AD converting units 21 and bit processing unit 22 in FIG. 2 and receives signals output from the solid-state imaging device 1. Differences between the bit processing unit 22-1 and the bit processing unit 22 in FIG. 3 will be described below.

A process of generating a correction factor K will be described first. When the power to a solid-state imaging apparatus is turned on, a reference signal input circuit 107 outputs a reference signal to a vertical signal line VL. Each signal selecting unit 109 successively selects a first signal G1 and a second signal G8, regardless of the signal level of the second signal G8. The selection signal φb is at low level when the first signal G1 is selected and is at high level when the second signal G8 is selected. The bit switching unit 227 successively outputs a low-gain signal and a high-gain signal. A data synchronizing unit 228 successively receives the low-gain and high-gain signals and outputs signals DATA1 and DATA2 in parallel. The signal DATA1 is a low-gain signal output by the bit switching unit 227 while the signal DATA2 is a high-gain signal output by the bit switching unit 227. A comparing unit 224 compares the signals DATA1 and DATA2, detects a gain error ΔV, and stores the reciprocal of the gain error ΔV as a gain error correction factor K in a correction data memory unit 225. That is, the comparing unit 224 detects a gain error ΔV between a first signal G1 and a second signal G8 when the first and second signals G1 and G8 are level-shifted into the same gain level. Generation of a correction factor K requires at least two signals, i.e., a first signal and a second signal. The first and second signals enable calculation of a correction factor for each of all column amplifying units. A more accurate correction factor can be obtained by calculating and averaging a plurality of correction factors.

A process at the time of imaging will be described. If correction factors are generated at the time of camera initialization and are stored in the memory, an exposing signal is output from a pixel 101 to the vertical signal line VL. A first signal G1 and a second signal G8 amplified by each column amplifying unit 102 are AD-converted by the AD converting unit 108 and are successively output from the solid-state imaging device 1. The digital signals output from the solid-state imaging device 1 are successively input to the bit processing unit 22-1. When the selection signal φb input from the solid-state imaging device 1 is at high level, a correction unit 226 corrects the input high-gain signal by multiplying the low-order 12 bits of data of the high-gain signal by a correction factor K in the correction data memory unit 225 and outputs a signal DATA3, as in FIG. 3. When the selection signal φb is at low level, the correction unit 226 outputs the input low-gain signal as the signal DATA3 without change.

Note that the correction unit 226 may correct one of a low-gain signal, a first signal G1, and a second signal G8 instead of correcting a high-gain signal. The bit processing unit 22-1 in FIG. 16 may be provided within the solid-state imaging device 1 in FIG. 15. In the case, a circuit design is prepared with the bit switching unit 227 replaced with the bit processing unit 22-1.

According to the present embodiment, the number of column amplifying units 102 can be made smaller than a case where the column amplifying unit 102 for amplifying a first signal G1 and the column amplifying unit 102 for amplifying a second signal G8 are separately provided, which enables a cost reduction. Since one of a first signal G1 and a second signal G8 is selected and is converted from an analog signal to a digital signal, the operating speed can be improved, compared to a case where both of a first signal G1 and a second signal G8 are converted from an analog signal to a digital signal. With the above-described configuration, a gain error in each column amplifying unit when signals amplified at different gains are obtained and/or a conversion error in each analog to digital converting unit can be reduced.

Sixth Embodiment

Figure 17:
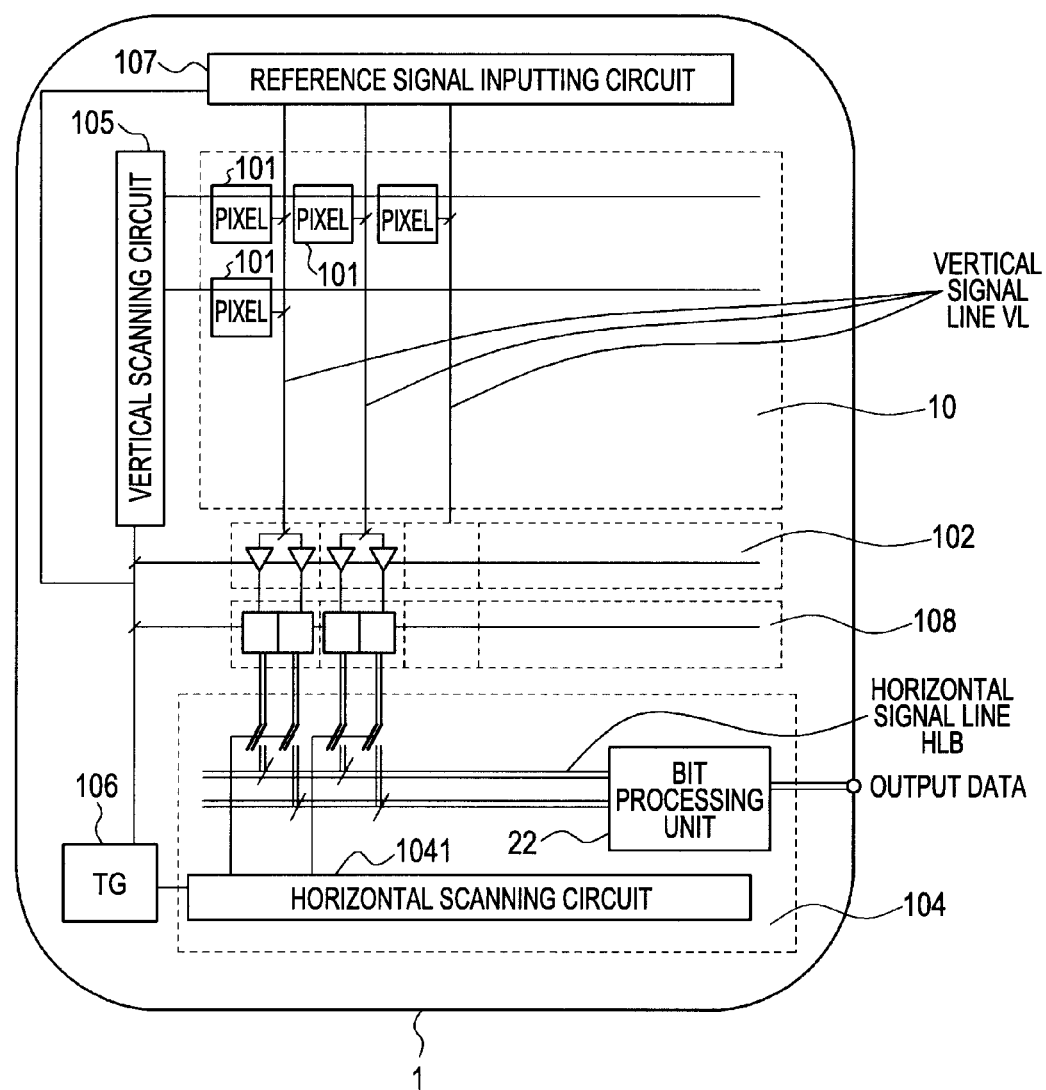
FIG. 17 is a diagram illustrating the schematic configuration of a solid-state imaging device according to a sixth embodiment.

FIG. 17 is a diagram illustrating the schematic configuration of a solid-state imaging device 1 according to a sixth embodiment of the present invention. The present embodiment is an embodiment obtained by providing the bit processing unit 22 in FIG. 3 within the solid-state imaging device 1 according to the fourth embodiment in FIG. 13. A bit processing unit 22 is provided on a horizontal signal line HLB. Since the bit processing unit 22 is provided within a solid-state imaging device 1, the solid-state imaging device 1 outputs only a 15-bit wide-dynamic-range signal after AD conversion. An external processing circuit unit includes only a DSP 23 (FIG. 2). Accordingly, a reduction in the size and cost of a solid-state imaging apparatus can be achieved. The imaging timing for a solid-state imaging apparatus according to the present embodiment is substantially the same as the imaging timing according to the fourth embodiment in FIG. 14, and a description of the imaging timing will be omitted.

According to the first to sixth embodiments, a gain error in each column amplifying unit 102 when signals amplified at different gains are obtained and/or a conversion error in the AD converting units 21 and 108 can be reduced. With the above-described configuration, a gain error in each column amplifying unit when signals amplified at different gains are obtained and/or a conversion error in each analog to digital converting unit can be reduced.

Note that the above-described embodiments merely illustrate specific examples for carrying out the present invention and that the technical scope of the present invention should not be restrictively interpreted due to the embodiments. In other words, the present invention can be implemented in various forms without departing from the technical idea or the main features of the present invention.

This application claims the benefit of Japanese Patent Applications No. 2010-221199, filed Sep. 30, 3010 and No. 2010-222371, filed Sep. 30, 2010, which are hereby incorporated by reference herein in their entirety

The invention claimed is:

1. A solid-state imaging apparatus comprising:
 a plurality of pixels arranged in a matrix for generating a signal by a photoelectric conversion;
 a column amplifying unit arranged corresponding to each of columns of the pixels, for outputting a first signal generated by amplifying the signal from the plurality of pixels at a first gain, and for outputting a second signal generated by amplifying the signal from the plurality of pixels at a second gain larger than the first gain;
 an analog to digital converter for converting the first and second signals from an analog signal to a digital signal;
 a comparing unit for receiving the digital signal from the analog to digital converter, level-shifting into the same gain level the first and second signals, and thereafter detecting a gain error between the level-shifted first and second signals; and
 a correction unit for correcting the first and second signals based on the gain error.

2. The solid-state imaging apparatus according to claim 1, wherein
 the comparing unit detects the gain error when the second signal is in a signal level lower than a saturation start signal level.

3. The solid-state imaging apparatus according to claim 1, wherein
 an identical one of the column amplifying units amplifies and outputs successively the first and second signals of one of the pixels.

4. The solid-state imaging apparatus according to claim 1, wherein
 an identical one of the same analog to digital converters successively converts the first and second signals of one of the pixels from the analog signal to the digital signal.

5. The solid-state imaging apparatus according to claim 1, wherein different column amplifying units amplify and output separately the first and second signals of one of the pixels.

6. The solid-state imaging apparatus according to claim 1, wherein
different analog to digital converters separately convert the first and second signals from the analog signal to the digital signal of one of the pixels.

7. The solid-state imaging apparatus according claim 1, further comprising
a correction data memory unit for storing a correction factor or an offset voltage correction value based on the gain error detected by the comparing unit,
the correction unit performs the correction based on the correction factor or the offset voltage correction value.

8. The solid-state imaging apparatus according to claim 1, further comprising
a bit shifting unit for selecting a signal corrected by the correction unit or the first or second signal not corrected by the correction unit.

9. The solid-state imaging apparatus according to claim 8, wherein
the bit shifting unit selects the signal corrected by the correction unit when the second signal is in the signal level lower than the saturation start signal level, and the bit shifting unit selects the first signal when the second signal is in the signal level higher than the saturation start signal level.

10. A solid-state imaging apparatus comprising:
a plurality of pixels arranged in a matrix for generating a signal by a photoelectric conversion;
a reference signal input unit for generating a reference signal;
a column amplifying unit arranged corresponding to each of columns of the pixels, for outputting a first signal generated by amplifying the signal from the plurality of pixels or the reference signal at a first gain, and for outputting a second signal generated by amplifying the signal from the plurality of pixels or the reference signal at a second gain larger than the first gain;
an analog to digital converter for converting the first and second signals from an analog signal to a digital signal;
a comparing unit for receiving the digital signal from the analog to digital converter, level-shifting into the same gain level the first and second signals, and thereafter detecting a gain error between the first and second signals, when the column amplifying unit outputs the first and second signal by amplifying the reference signal; and
a correction unit for correcting, based on an output of the first and second signal by amplifying the reference signal from the column amplifying unit, the first and second signals based on the gain error.

11. The solid-state imaging apparatus according to claim 10, further comprising
a signal line for connecting the plurality of pixels each one to each one of the plurality of column amplifying units, wherein
the reference signal input unit outputs the reference signal selectively to the signal line.

12. The solid-state imaging apparatus according to claim 10, wherein
the pixel comprises:
a photoelectric conversion element for generating the signal by the photoelectric conversion;
a transfer switch connected to the photoelectric conversion element; and
a field effect transistor being connected through the transfer switch to the photoelectric conversion element, and having a drain connected to a power source voltage node and a source outputting the signal to the column amplifying unit, and
the reference signal input unit outputs the reference signal selectively to the gate of the field effect transistor.

13. The solid-state imaging apparatus according to claim 10, wherein
when a power source is turned on, the column amplifying unit outputs the first and second signals generated by amplifying the reference signal, and the comparing unit detects the gain error.

14. The solid-state imaging apparatus according to according to claim 10, further comprising
a bit shifting unit for selecting the signal corrected by the correction unit, or first or second signal not corrected by the correction unit.

15. The solid-state imaging apparatus according to according to claim 14, wherein
the bit shifting unit selects the signal corrected by the correction unit when the second signal is at a level lower than a level of the first signal, and the bit shifting unit selects the first signal when the second signal is at a level higher than the level of the first signal.

* * * * *